United States Patent
Forrest et al.

(10) Patent No.: US 6,972,431 B2
(45) Date of Patent: Dec. 6, 2005

(54) MULTILAYER ORGANIC PHOTODETECTORS WITH IMPROVED PERFORMANCE

(75) Inventors: Stephen R. Forrest, Princeton, NJ (US); Jiangeng Xue, Piscataway, NJ (US)

(73) Assignee: Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/723,953

(22) Filed: Nov. 26, 2003

(65) Prior Publication Data

US 2005/0110007 A1 May 26, 2005

(51) Int. Cl.[7] ............................................. H01L 35/24
(52) U.S. Cl. ............................ 257/40; 257/642; 438/82
(58) Field of Search .................... 257/40, 642, E39.007, 257/E51.001, E51.003, E51.01, E51.011, E51.013, E51.015, E51.017, E51.027, E27.117, E25.008; 438/82, 99, 725, 780; 427/596; 430/200, 201, 270.1, 273.1, 7, 11, 327; 428/413, 447

(56) References Cited

U.S. PATENT DOCUMENTS

| | | | |
|---|---|---|---|
| 6,013,982 A | 1/2000 | Thompson et al. | 313/506 |
| 6,087,196 A | 7/2000 | Sturm et al. | 438/29 |
| 6,097,147 A | 8/2000 | Baldo et al. | 313/506 |
| 6,294,398 B1 | 9/2001 | Kim et al. | 438/22 |
| 6,333,458 B1 | 12/2001 | Forrest et al. | 136/259 |
| 6,337,102 B1 | 1/2002 | Forrest et al. | 427/64 |
| 6,451,415 B1 | 9/2002 | Forrest et al. | 428/212 |
| 6,468,819 B1 | 10/2002 | Kim et al. | 438/22 |
| 6,580,027 B2 | 6/2003 | Forrest et al. | 136/263 |
| 2004/0067324 A1 * | 4/2004 | Lazarev et al. | 428/1.31 |

OTHER PUBLICATIONS http://environmentalchemistry.com/yogi/periodic/Au.html*
Forrest et al., "Active Optoelectronics Using Thin–Film Organic Semiconductors," IEEE J. Sel. Top. Quantum Electron. 6, 1072 (2000).
Peumans et al., "Efficient Photon Harvesting at High Optical Intensities in Ultrathin Organic Double–Heterostructure Photovoltaic Diodes," Appl. Phys. Lett. 76, 3855 (2000).
Peumans et al., "Small Molecular Weight Organic ThinFilm Photodetectors and Solar Cells," J. Appl. Phys. 93, 3693 (2003).
Tang et al., "Two–Layer Organic Photovoltaic Cell," Appl. Phys. Lett. 48, 183 (1986).

(Continued)

*Primary Examiner*—Nathan J. Flynn
*Assistant Examiner*—Scott R. Wilson
(74) *Attorney, Agent, or Firm*—Kenyon & Kenyon

(57) ABSTRACT

The present invention generally relates to organic photodetectors. Further, it is directed to an optimized organic photodetector having reduced dark current and high efficiency and response time.

17 Claims, 25 Drawing Sheets

OTHER PUBLICATIONS

Shah et al., "Photovoltaic Technology: The Case for Thin-Film Solar Cells," Science 285, 692 (1999).

Peumans et al., "Very–high–efficiency Double–heterostructure Copper Phthalocyanine/$C_{60}$ Photovoltaic cells," Appl. Phys. Lett. 79, 126 (2001).

Peumans et al., "Efficient, High–Bandwidth Organic Multilayer Photodetectors," Appl. Phys. Lett. 76, 2650–52.

Welford et al., "High Collection Nonimaging Optics", Academic Press, pp. 172–175 (1989).

Parker, "Carrier Tunneling and Device Characteristics in Polymer Light–Emitting Diodes," J. Appl. Phys. 75, 1656 (1994).

Fowler et al., "Electron Emission in Intense Electric Fields," Proc. R. Soc. London Ser. A 119, 173 (1928).

Stratton, "Theory of Field Emission from Semiconductors," Phys. Rev. 125, 67, (1962).

Hill et al., "Organic Semiconductor Heterointerfaces Containing Bathocuproine," J. Appl. Phys. 86, 2116 (1999).

Forrest, "Ultrathin Organic Films Grown by Organic Molecular Beam Deposition and Related Techniques," Chem. Rev. 97, 1793 (1997).

Hill et al., "Organic Semiconductor Interfaces: Electronic Structure and Transport Properties," Appl. Surf. Sci. 166, 354 (2000).

Hill et al., "Charge–Separation Energy in Films of π–Conjugated Organic Molecules," Chem. Phys. Lett. 327, 181 (2000).

Ueno et al., "Parabolic Dispersion and Effective Mass of Hot Electrons in Oriented Thin Films of Copper Phthalocyanine Determined by Means of Low–Energy–Electron Transmission," Phys. Rev. B 44, 6472 (1991).

Gu et al., "Transparent Organic Light Emitting Devices," Appl. Phys. Lett. 68, 2606 (1996).

Gu et al., "Transparent Stacked Organic Light Emitting Devices. I. Design Principles and Transparent Compound Electrodes," J. Appl. Phys. 86, 4067 (1999).

Drechsel et al., "Organic Mip–diodes by p–doping of amorphous wide–gap semiconductors: CV andf impedance spectroscopy", Synth. Met. 127, 201–205 (2002).

Shirota et al., "Multilayered Organic Electroluminescent device Using a Novel Starburst Molecule, 4,4', 4"–tris(3–methylphenylphenylamino)triphenylamine, as a hole transport material," Appl. Phys. Lett. 65, 807 (1994).

Djurisic et al., "Indium–tin–oxide Surface Treatments: Influence on the performance of CuPc/$C_{60}$ solar cells," J. Appl. Phys. 93, 5472 (2003).

Shtein, et al., U.S. Appl. No. 10/233,470, filed Sep. 4, 2002, entitled "Process and Apparatus for Organic Vapor Jet Deposition".

* cited by examiner

MULTILAYER ORGANIC PHOTODETECTORS WITH IMPROVED PERFORMANCE

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of agreement.

FIELD OF THE INVENTION

The present invention generally relates to organic photodetectors. More specifically, it is directed to organic photodetectors having a reduced dark current.

BACKGROUND

Small molecular weight organic materials have found a wide range of optoelectronic applications in the past two decades due to their advantages such as being lightweight, cost effective and compatible with flexible substrates [S. R. Forrest, IEEE J. Sel. Top. Quantum Electron. 6, 1072 (2000)]. The broad absorption spectra and high absorption coefficients ($\sim 10^5$ cm$^{-1}$), as well as the chemists' ability to tailor the electronic and optoelectronic properties to suit a particular application or spectral range, make organic materials of particular interest for application to photodetection [P. Peumans, V. Bulovic, and S. R. Forrest, Appl. Phys. Lett. 76, 3855 (2000); P. Peumans, A. Yakimov, and S. R. Forrest, J. Appl. Phys. 93, 3693 (2003)] and solar energy conversion [P. Peumans, A. Yakimov, and S. R. Forrest, J. Appl. Phys. 93, 3693 (2003); C. W. Tang, Appl. Phys. Lett. 48, 183 (1986); A. Shah, P. Torres, R. Tscharner, N. Wyrsch, and H. Keppner, Science 285, 692 (1999); P. Peumans and S. R. Forrest, Appl. Phys. Lett. 79, 126 (2001)]. The low indices of refraction of the organic materials and their corresponding transparent substrates (glass or plastics) also allow for efficient light coupling into devices, leading to potentially high quantum efficiencies.

Optoelectronic devices rely on the optical and electronic properties of materials to either produce or detect electromagnetic radiation or to generate electricity from ambient electromagnetic radiation. Photosensitive optoelectronic devices, such as photovoltaic (PV) devices and photodetectors, convert electromagnetic radiation into electricity.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \rightarrow S_0^*$. Here $S_0$ and $S_0^*$ denote ground and excited molecular states, respectively. This energy absorption is associated with the promotion of an electron from a bound state in the highest occupied molecular orbital (HOMO), which may be a 1-bond, to the lowest unoccupied molecular orbital (LUMO), which may be a $\pi^*$-bond, or equivalently, the promotion of a hole from the LUMO to the HOMO. In organic thin-film photoconductors, the generated molecular state is generally believed to be an exciton, i.e., an electron-hole pair in a bound state which is transported as a quasi-particle. The excitons can have an appreciable lifetime before geminate recombination, which refers to the process of the original electron and hole recombining with each other, as opposed to recombination with holes or electrons from other pairs. To produce a photocurrent the electron-hole pair must become separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a heterojunction. In traditional semiconductor theory, materials for forming heterojunctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the HOMO and the LUMO, called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Due to these unique electronic properties of organic materials, rather than designating them as "p-type" or "acceptor-type" and "n-type" or "donor-type", the nomenclature of "hole-transporting-layer" (HTL) or "electron-transporting-layer" (ETL) may be used. In this designation scheme, an ETL will be preferentially electron conducting and an HTL will be preferentially hole transporting.

A typical prior art photovoltaic device configuration is the organic bilayer cell. In the bilayer cell, charge separation predominantly occurs at the organic heterojunction. The built-in potential is determined by the HOMO-LUMO energy difference between the two materials contacting to form the heterojunction. The HOMO-LUMO gap offset between the HTL and ETL produce an electric field around the HTL/ETL interface.

Multilayer organic devices can be operated as photodetectors. In this case an external electric field is generally applied to facilitate extraction of the separated charges. The dark current (current that occurs under an applied voltage when the device is not exposed to light) is a major source of noise. Optimizing the signal-to-noise ratio thus involves minimizing the dark current while maximizing the external quantum efficiency.

SUMMARY OF THE INVENTION

The present invention provides organic-based photodetectors having a reduced dark current. The dark current may be reduced (i) by the use of a high work function anode, (ii) by the use of electron donor layer and the electron acceptor layer that provide a high energy barrier for electron injection from the anode into the electron acceptor layer, and/or (iii) by placing a thick donor layer adjacent to the anode.

In one embodiment, the invention provides an organic photodetector comprising a high work function anode, an active region an exciton blocking layer, and a cathode. The active region comprises one or more subcells in series, wherein each subcell comprises an organic electron donor layer and an organic electron acceptor layer, and wherein the thicknesses of the organic electron donor layer and the organic electron acceptor layer are low enough to allow tunneling. Preferably, the anode comprises a material having a work function greater than about 4.6 eV.

In another embodiment, the invention provides an organic photodetector comprising an anode, an active region comprising one or more subcells in series, wherein each subcell comprises an organic electron donor layer and an organic electron acceptor layer, wherein the thicknesses of the organic electron donor layer and the organic electron acceptor layer are low enough to allow tunneling, an exciton blocking layer, and a cathode. In this embodiment, the electron affinity of the organic acceptor layer is about 0.3 eV less than the work function of the anode.

In another embodiment, the invention provides an organic photodetector comprising an anode, a first subcell comprising an organic electron donor layer adjacent to the anode and having a sufficient thickness to inhibit tunneling into the adjacent acceptor layer, one or more additional subcells in series, wherein each additional subcell comprises an organic electron donor layer and an organic electron acceptor layer, wherein the thicknesses of the organic electron donor layer and the organic electron acceptor layer are low enough to allow tunneling, an exciton blocking layer and a cathode.

BRIEF DESCRIPTION OF THE DRAWINGS

The foregoing and other features of the present invention will be more readily apparent from the following detailed description of exemplary embodiments taken in conjunction with the attached drawings.

DETAILED DESCRIPTION

The present invention provides an organic photodetector having a reduced dark current that comprises an anode, a cathode and an active region between the anode and the cathode. The active region comprises one or more subcells in series, wherein each subcell comprises an electron donor layer adjacent to an electron acceptor layer. The dark current may be reduced (i) by the use of a high work function anode, (ii) by the use of electron donor layer and the electron acceptor layer that provide a high energy barrier for electron injection from the anode into the electron acceptor layer, and/or (iii) by placing a thick donor layer adjacent to the anode.

Figure 1:
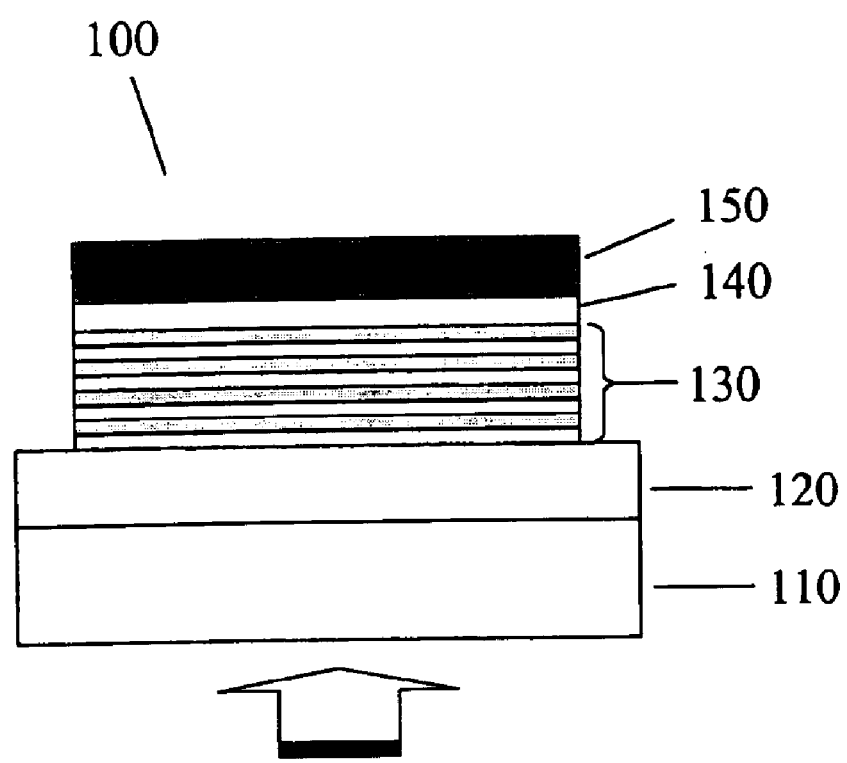
FIG. 1 shows a multilayer organic photodetector comprising a substrate, anode, active region, blocking layer, and cathode. The arrow indicates the illumination direction.

FIG. 1 shows an organic photodetector 100 that may be fabricated in accordance with embodiments of the invention. Organic photodetector 100 is fabricated over a substrate 110, and may include an anode 120, an active region 130, an exciton blocking layer 140, and a cathode 150. Additional layers may be incorporated into the device. Device 100 may be fabricated by depositing the layers described, in order. The Figures are not necessarily drawn to scale.

Substrate 110 may be any suitable substrate that provides desired structural properties. Substrate 110 may be flexible or rigid. Substrate 110 is preferably a transparent to the one or more wavelengths of light. Plastic, glass and quartz are examples of preferred rigid substrate materials. Other substrates may be used. The material and thickness of substrate 110 may be chosen to obtain desired structural and optical properties.

The material of anode 120 is a high work function material. The term "anode" is used herein such that in a photodetector under illumination, holes move to the anode from the adjacent photo-conducting material, which is equivalent to electrons moving in the opposite manner. In a preferred embodiment, the anode material has a work function higher than about 4 eV. Preferred anode materials include conductive metal oxides, such as indium tin oxide (ITO) and indium zinc oxide (IZO), aluminum zinc oxide (AlZnO), and metals. A preferred transparent substrate and anode combination is commercially available ITO (anode) deposited on glass or plastic (substrate). Anode 120 may be opaque and/or reflective. Where anode 120 is transparent, there may be a range of thickness for a particular material that is thick enough to provide the desired conductivity, yet thin enough to provide the desired degree of transparency. Other anode materials and structures may be used.

Cathode 150 may be any suitable material or combination of materials known to the art. Cathode 150 may be transparent or opaque, and may be reflective. Metals and metal oxides are examples of suitable cathode materials. Cathode 150 may be a single layer, or may have a compound structure. The part of cathode 150 that is in contact with the underlying organic layer is preferably made of a material having a work function lower than about 4 eV (a "low work function material"). Other cathode materials and structures may be used.

In preferred embodiments of the invention, device 100 comprises an exciton blocking layer 140, as described in U.S. Pat. No. 6,097,147, Peumans et al, *Applied Physics Letters* 2000, 76, 2650–52, and U.S. Pat. No. 6,451,415, filed Nov. 26, 1999, both incorporated herein by reference. Higher internal and external quantum efficiencies have been achieved by the inclusion of an exciton blocking layer to confine photogenerated excitons to the region near a dissociating interface and to prevent parasitic exciton quenching at the interface of an electrode and the active region. In addition to limiting the volume over which excitons may diffuse, an exciton blocking layer can also act as a diffusion barrier to substances introduced during deposition of the electrodes. In some circumstances, an exciton blocking layer can be made thick enough to fill pinholes or shorting defects which could otherwise render an organic photodetector non-functional. An exciton blocking layer can therefore help protect fragile organic layers from damage produced when electrodes are deposited onto the organic materials.

It is believed that the exciton blocking layers derive their exciton blocking property from having a LUMO-HOMO energy gap substantially larger than that of the adjacent organic semiconductor from which excitons are being blocked. Thus, the confined excitons are inhibited from existing in the exciton blocking layer due to energy considerations. While it is desirable for the exciton blocking layer to block excitons, it is not desirable for the exciton blocking layer to block all charge. However, due to the nature of the adjacent energy levels, an exciton blocking layer may block one sign of charge carrier. An exciton blocking layer will exist between two layers, usually an organic photosensitive semiconductor layer (for example in the active region) and a electrode or charge transfer layer. The adjacent electrode or charge transfer layer will be in context either a cathode or an anode. Therefore, the material for an exciton blocking layer in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side exciton blocking layer to have a LUMO level closely matching the LUMO level of the adjacent organic material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic photodetector.

In a preferred embodiment of the invention, an exciton blocking layer is situated between the active region and the cathode. A preferred material for the exciton blocking layer comprises 2,9-dimethyl-4,7-diphenyl-1,10-phenanthroline (also called bathocuproine or BCP), which is believed to have a LUMO-HOMO separation of about 3.5 eV or bis(2-methyl-8-hydroxyquinolinoato)-aluminum(III)phenolate ($Alq_2OPH$). BCP is an effective exciton blocker which can easily transport electrons to the cathode from an adjacent acceptor layer. The exciton blocking layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material may result in a lower quality film with possible defects such as shorts, voids or intrusion of electrode material. Accordingly, it has been found that doping of some exciton blocking materials, such as BCP, that exhibit this effect with a suitable, relatively large and stable molecule can stabilize the exciton blocking layer to prevent performance degrading morphology changes. It should be further appreciated that doping of an exciton blocking layer which is transporting electrons in a given device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

As would be generally understood by one skilled in the art, use of the term "blocking" layer is meant to suggest that the layer is comprised of a material, or materials, that provide a barrier that significantly inhibits transport of excitons through the layer, without suggesting or implying that the barrier completely blocks excitons. The presence of such a barrier typically manifests itself in terms of producing substantially higher efficiencies as compared to devices lacking the blocking layer.

Active region 130 is comprised of one or more "subcells." Each subcell of the active region comprises an acceptor material and a donor material which provide a heterojunction. The donor material has an ionization potential that is smaller than that of the acceptor material. Further, the ionization potential HOMO/LUMO gap of the donor layer must be smaller than that of the acceptor layer. Generally, the materials comprising the donor or acceptor layers should have long exciton diffusion length, and thus are preferably those materials which lend themselves to ordered stacking of the molecules, such as planar, aromatic molecules.

The acceptor material may be comprised of, for example, perylenes, naphthalenes, fullerenes or nanotubules. A preferred acceptor material is 3,4,9,10-perylenetetracarboxylic bis-benzimidazole (PTCBI). Alternatively, the acceptor layer may be comprised of a fullerene material as described in the U.S. Pat. No. 6,580,027, which is incorporated herein by reference in its entirety.

Adjacent to the acceptor layer, is a layer of organic donor-type material. The boundary of the acceptor layer and the donor layer forms a heterojunction which may produce an internally generated electric field. A preferred material for the donor layer is a pthalocyanine or a porphyrin, or a derivative or transition metal complex thereof. Copper pthalocyanine (CuPc) is a particularly preferred donor material.

In preferred embodiments, the active region comprises multiple subcells. The active region is thus comprised of an alternating donor-acceptor multilayer stack. It is particularly preferred that the alternating donor layers and acceptor layers be thin layers in order to allow charge tunneling.

Representative embodiments may also comprise transparent charge transfer layers. As described herein charge transfer layers are distinguished from ETL and HTL layers by the fact that charge transfer layers are frequently, but not necessarily, inorganic and they are generally chosen not to be photoconductively active. The term "charge transfer layer" is used herein to refer to layers similar to but different from electrodes in that a charge transfer layer only delivers charge carriers from one subsection of an optoelectronic device to the adjacent subsection.

In another preferred embodiment of the invention, a charge transfer layer is situated between the anode and the donor layer. A preferred material for this layer comprises a film of 3,4-polyethylenedioxythiophene:polystyrenesulfonate (PEDOT:PSS). The PEDOT:PSS layer functions as an anode smoothing layer. The introduction of the PEDOT:PSS layer between the anode (ITO) and the donor layer (CuPc) leads to fabrication yields of close to 100%. We attribute this to the ability of the spin-coated PEDOT:PSS film to planarize the ITO, whose rough surface could otherwise result in shorts through the thin molecular film.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

A concentrator configuration can be employed to increase the efficiency of the device, where photons are forced to make multiple passes through the thin absorbing regions. Co-pending U.S. patent application Ser. No. 09/449,800 entitled "Highly Efficient Multiple Reflection Photosensitive Optoelectronic Device with Optical Concentrator" (hereinafter "'800 application"), incorporated herein by reference, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the thin film of photoconductive material. The geometries disclosed in the '800 application therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

The '800 application also discloses an aperture in either one of the reflecting surfaces or an external side face of the waveguiding device for coupling to an optical concentrator, such as a Winston collector, to increase the amount of electromagnetic radiation efficiently collected and delivered to the cavity containing the photoconductive material. Exemplary non-imaging concentrators include a conical concentrator, such as a truncated paraboloid, and a trough-shaped concentrator. With respect to the conical shape, the device collects radiation entering the circular entrance opening of diameter $d_1$ within $\pm\theta_{max}$ (the half angle of acceptance) and directs the radiation to the smaller exit opening of diameter $d_2$ with negligible losses and can approach the so-called thermodynamic limit. This limit is the maximum permissible concentration for a given angular field of view. Conical concentrators provide higher concentration ratios than trough-shaped concentrators but require diurnal solar tracking due to the smaller acceptance angle. (After *High Collection Nonimaging Optics* by W. T. Welford and R. Winston, hereinafter "Welford and Winston") pp. 172–175, Academic Press, 1989, incorporated herein by reference).

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional photodetectors may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials may be used. Also, the layers may have various sublayers. The names given to the various layers herein are not intended to be strictly limiting as to the function of the layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method.

The present invention provides an organic photodetector having a reduced dark current. The dark current may be reduced (i) by the use of a high work function anode, (ii) by the use of electron donor layer and the electron acceptor layer that provide a high energy barrier for electron injection from the anode into the electron acceptor layer, and/or (iii) by placing a thick donor layer adjacent to the anode.

The anode is preferably selected from a material that has a high work function. In some embodiments the surface of the anode layer may be treated in order to increase the work function. Surface treatments may include treatment with oxygen plasma or UV ozone, treatment with an oxidizing agent or an acid, such as hydrogen peroxide, aqua regia, or nitric acid, coating with a p-type doped organic layer, or spin-coating with a transparent conducting organic polymer, such as PEDOT:PSS. In other embodiments, the method of fabrication of the anode layer may effect the work function. In preferred embodiments, the anode will have a work function greater than about 4.6 eV.

Figure 3:
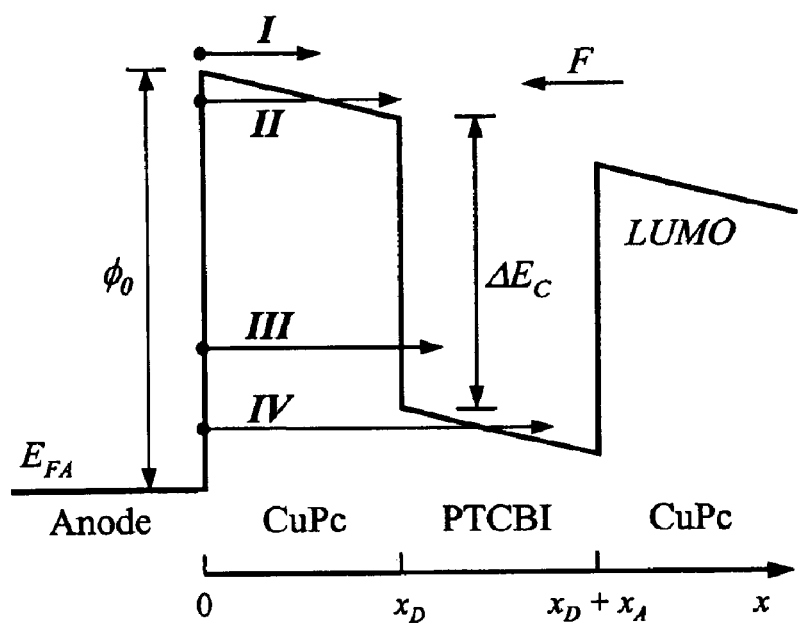
FIG. 3 shows an energy level diagram illustrating the several electron injection components at the anode/organic interface. $E_{FA}$ is the Fermi level of the anode, 00 is the barrier height for electron injection from the anode into CuPc, $\Delta E_C$ is the lowest unoccupied molecular orbital (LUMO) level offset between CuPc and PTCBI, F is the external electric field, and XD and $x_A$ are the thicknesses of the CuPc and PTCBI layers, respectively. Numerals I to IV represent different components of the electron injection current.

A major contribution to the dark current may come from electrons tunneling through the entire thickness of the first donor layer, and directly into the LUMO of the following acceptor layer (see component IV in FIG. 3). Therefore, the tunneling current may depend on the fraction of the electron population in the anode that has sufficient energy to tunnel into the acceptor LUMO. That is, it may depend on the relative position of the anode Fermi level with respect to the acceptor LUMO. A low anode work function corresponds to a low barrier height that electrons in the anode must overcome to tunnel into the acceptor LUMO, thereby leading to a high dark current.

A particularly preferred anode material is ITO. The work function of as-received commercially available ITO ranges from 4.1 to 4.5 eV as measured by photoelectron spectroscopy (PES) or the Kelvin method. Oxidative surface treatments such as oxygen plasma, UV ozone, or reaction with hydrogen peroxide, aqua regia, or nitric acid may increase the ITO work function up to 4.7–4.8 eV. Although the exact nature of the physical processes contributing to the increase of the ITO work function is still not entirely clear, it may be attributed to the removal of carbon-containing contaminants, the change of surface chemical composition, or the formation of a surface dipole layer. The variation in the reported work function of as-received or surface-treated commercial ITO films can be attributed to compositional and/or structural variations in films obtained from different suppliers, as well as different parameters used in the surface treatments and the resolution limitation of the measurements (e.g. 0.1–0.2 eV for PES). Techniques used to deposit ITO include thermal evaporation, magnetron sputtering, chemical vapor deposition, spray pyrolysis, and pulsed laser deposition (PLD). Generally, these techniques require a high substrate temperature (200–500° C.) during deposition, or a post-deposition annealing at a high temperature (400–700° C.) to produce ITO films with high conductivity and transparency. Room temperature radio frequency (rf) magnetron sputtering produces ITO films with optical and electronic properties quite different from commercial ITO films. An increase of the $O_2$ concentration in the sputtering gas mixture improves hole injection from ITO, and may increase the work function.

In another embodiment of the invention, the dark current may be reduced by placing a thick donor layer adjacent to the anode. In this embodiment the first donor layer (the donor layer adjacent to the anode) is of sufficient thickness to inhibit tunneling into the adjacent acceptor layer. The tunneling current may thus depend on the thickness of the first acceptor layer. The thickness of the layer may be dependent on the nature of the acceptor material in relation to the anode material. The amount of tunneling into the acceptor layer is relative to the position of the acceptor LUMO with respect to the anode Fermi level. The higher the acceptor LUMO is above the anode Fermi level, the thinner the first donor layer which will inhibit tunneling. In preferred embodiments, the thickness of the first donor layer is at least about 60 Å.

In another embodiment, the dark current may be reduced by the use of an electron donor layer and an electron acceptor layer that provide a high energy barrier for electron injection from the anode into the electron acceptor layer. In a preferred embodiment, the acceptor layer is selected to have a low electron affinity. In this embodiment the electron affinity of the acceptor layer is preferably about 0.3 eV less than the work function of the anode, and more preferably about 0.4 eV less than the work function of the anode. Use of a donor material that has a low electron affinity may further inhibit electron injection from the anode into the electron acceptor layer.

The photodetection process in an organic photodetector consists of photon absorption in the photoactive region to form excitons, dissociation of excitons leading to the creation of free electrons and holes (or, more precisely, to electron and hole polarons), and collection of the free charges at opposing electrodes. The internal quantum efficiency, $\eta_{int}$, of a photodetector, defined as the ratio of the number of electrons (or holes) collected at the cathode (or anode) to the number of photons absorbed, can be expressed as:

$$\eta_{int} = \eta_{ED} \eta_{CC}, \quad (1)$$

where $\eta_{ED}$ is the efficiency of exciton dissociation, and $\eta_{CC}$ is the carrier collection efficiency defined as the ratio of the number of carriers collected at the electrodes to the total number of carriers generated after exciton dissociation. The external quantum efficiency, $\eta_{ext}$, defined as the ratio of the number of carriers collected at an electrode to the number of incident photons, is related to $\eta_{int}$ through:

$$\eta_{ext} = \eta_{abs} \eta_{int}, \quad (2)$$

where $\eta_{abs}$ is the ratio of the number of photons absorbed in the photodetector active region to the total number of photons incident on the photodetector. Under monochromatic illumination, $$\eta_{ext} = \frac{I_{ph}}{P_0} \frac{h\nu}{q}, \qquad (3)$$

where $I_{ph}$ is the photocurrent, $P_o$ is the total optical power incident on the photodetector, $h\nu$ is the photon energy, and q is the electron charge.

For a multilayer organic photodetector with thin individual layers in the active region, exciton dissociation primarily occurs at donor-acceptor interfaces. For photodetectors with thick layers, excitons generated far from the interfaces may also dissociate in a strong external electric field in an Onsäger-type process [E. A. Silinsh and V. Capek, *Organic molecular crystals: Interaction, localization, and transport phenomena* (Springer, New York, 1994)]. For Example, the field-induced exciton dissociation efficiency can be $\eta_{FI}$>0.1 for electric fields >$10^6$ V/cm in CuPc and PTCBI. CuPc and PTCBI are referred to as representative donor and acceptor materials and the discussion may readily be applied to other donor and acceptor materials. Since recombination of photogenerated electrons and holes can be neglected once they are spatially separated, $\eta_{CC}$ approaches unity in a device with a single donor/acceptor heterojunction. However, for a device containing multiple donor/acceptor heterojunctions, electrons in the LUMO of a acceptor layer (i.e. PTCBI) other than the one nearest to the cathode must overcome the potential barrier formed by the LUMO of the adjacent donor layer (i.e., CuPc), and a similar situation exists for the holes in the donor [see FIG. 2]. In this case, $\eta_{CC}$ depends on the barrier thickness and height. It has been shown that $\eta_{CC}$ dramatically increases when the layer thickness is reduced from 40 Å to 20 Å[P. Peumans, A. Yakimov, and S. R. Forrest, J. Appl. Phys. 93, 3693 (2003)], suggesting that the photogenerated carriers are able to tunnel through the thinnest barriers, and the maximum tunneling length is empirically found to be between 20 Å and 40 Å.

Tunneling injection of charge carriers at electrode/organic semiconductor interfaces has been well studied for a single polymer layer sandwiched between two electrodes, [I. D. Parker, J. Appl. Phys. 75, 1656 (1994)] which can be described by Fowler-Nordheim tunneling theory. [R. H. Fowler and L. Nordheim, Proc. R. Soc. London Ser. A 119, 173 (1928)]. However, due to the heterostructure in the active region, the current-voltage characteristics of a multilayer organic photodetector cannot be accurately described by simple models such as thermionic or thermionic-field emission, [S. M. Sze, *Physics of semiconductor devices*, 2nd ed. (Wiley, New York, 1981)] or Fowler-Nordheim tunneling.

Here we consider electron injection from the anode into the organic active region using a semi-classical model. [R. Stratton, Phys. Rev. 125, 67 (1962); K. C. Kao and W. Hwang, *Electrical transport in solids* (Pergamon Press, New York, 1981)]. The current density is given by:

$$J = q \int P_T v_x f(E) D(E) dE, \qquad (4)$$

where $f(E)=\{\exp[(E-E_{FA})/kT]+1\}^{-1}$ is the Fermi-Dirac distribution of electrons in the anode with Fermi energy $E_{FA}$. Also, k is Boltzmann's constant, T is the temperature, D(E) is the density of states in the organic layer, $v_x$ is the electron velocity in the x-direction taken as normal to the substrate surface, and $P_T$ is the electron transmission probability from the anode into the organic active region. Based on the nearly free electron approximation, the current density due to electron injection from the anode into the organic active region is $$J \approx \frac{4\pi m^* qkT}{h^3} \int_0^\infty P_T(E) \exp[-(E-E_{FA})/kT] dE, \qquad (5)$$

where $m^*$ is the electron effective mass and h is Planck's constant. Injection of electrons with energies that maximizes $P_T(E) \exp[-(E-E_{FA})/kT]$ dominates the total current. Let $$c(E) = \frac{d}{dE} \ln P_T(E),$$

then the dominant injection level at $E=E_m$ is determined by $$c(E_m) = 1/kT. \qquad (6)$$

Given a barrier potential profile $\phi(x)$, we can obtain $P_T(E)$ according to the WKB approximation, $$P_T(E) = \exp\left\{-\frac{4\pi}{h} \int_{x_1}^{x_2} [2m^*(\phi(x)-E)]^{1/2} dx\right\}, \qquad (7)$$

where $x_1$ and $x_2$ are the classical turning points at which $\phi(x)=E$. [L. D. Landau and E. M. Lifshitz, *Quantum Mechanics* (Addison-Wesley, Reading, Mass., 1958)]. It may be difficult to accurately describe $\phi(x)$ in our system due to insufficient data on the surface state distribution and residual doping densities in the organics. Nevertheless, neglecting image force contributions, we can use a trapezoidal potential approximation (shown in FIG. 3) in the presence of an external electric field, viz.:

$$\phi(x) = E_{FA} + \phi_0 - qFx, \text{ for } 0 < x < x_D = E_{FA} + \phi_0 - \Delta E_C - qFx, \text{ for } x_D < x < x_C + (8)$$

where $\Delta E_C$ is the LUMO level offset between CuPc and PTCBI, $\phi_0$ is the energy barrier for electron injection from the anode into CuPc, F is the external electric field, and $x_D$ and $x_A$ are the thicknesses of the CuPc (donor) and PTCBI (acceptor) layers, respectively. This system resembles a metal-insulator-semiconductor (MIS) tunnel diode, but with a relatively small barrier height for carrier injection, and heterojunctions in the semiconductor layer. The inclusion of image force contributions only leads to an increase in $\phi_0 - \Delta E_C$ by approximately 0.05 eV, which does not affect our conclusions.

The barrier height for hole injection from solvent-cleaned commercial ITO into CuPc is 0.7±0.1 eV as measured by UPS. [I. G. Hill and A. Kahn, J. Appl. Phys. 86, 2116 (1999)]. Using an optical gap of 1.7±0.1 eV for CuPc, we obtain a barrier height $\phi_0$~1 eV for electron injection from ITO into CuPc. The actual barrier height could be even higher considering the underestimation of the HOMO-LUMO energy gap using the optical gap, discussed further below. Therefore, we can neglect thermionic emission of electrons (component I in FIG. 3, $E-E_{FA} \geq \phi_0$) at the ITO/CuPc interface except at very high temperatures. Component II ($\phi_0 - qFx_D < E - E_{FA} - \phi_0$) corresponds to thermionic-field emission, or thermally-assisted tunneling, which becomes increasingly important under intense electric fields and at low temperatures. Components III ($\phi_0 - \Delta E_C - qFx_D < E - E_{FA} < \phi_0 - qFx_D$) and IV ($E - E_{FA} < \phi_0 - \Delta E_C - qFx_D$) correspond to electron tunneling through the entire thickness of the first CuPc layer into the potential well formed by the PTCBI LUMO level, both of which are thermionic-field emission processes. We only consider the tunneling of electrons into the first PTCBI LUMO energy well, although electrons with lower energies tunneling directly into the second or further PTCBI LUMO wells may contribute to the total current at the lowest temperatures.

Figure 4:
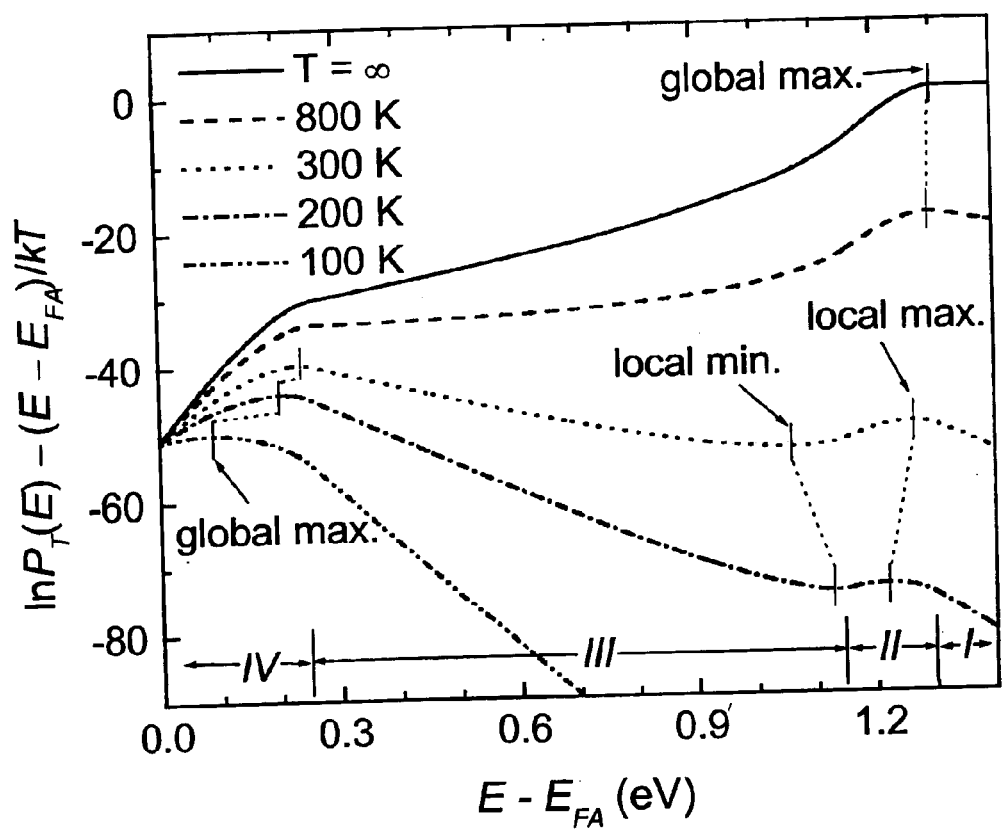
FIG. 4 shows the energy dependence of $[\ln P_T(E)-(E-E_{FA})/kT]$ at different temperatures calculated using the potential profile illustrated in FIG. 3 assuming typical parameters of F=0.5 MV/cm, $\phi_0$=1.3 eV, $\Delta E_C$=0.9 eV, $x_D=x_A=30$ Å, and m*=$m_e$. The energy regions for components I to IV are indicated. The minimum and maximum positions of $[\ln P_T(E)-(E-E_{FA})/kT]$, which are marked by short vertical lines and whose evolution with temperature are shown by the dotted lines, are all solutions to c(E)=1/kT; however, only the global maxima correspond to the dominant injection levels.

The relative importance of these injection components can be evaluated given the trapezoidal profile of $\phi(x)$. Shown in FIG. 4 is the energy dependence of $[\ln P_T(E)-(E-E_{FA})/kT]$ at different temperatures with typical parameters $F=0.5$ MV/cm, $\phi_0=1.3$ eV, $\Delta E_C=0.9$ eV, $x_D=x_A=30$ Å, and $m^*=m_e$ where $m_e$ is the free-electron mass. The dominant electron injection level, which corresponds to the global maximum of $[\ln P_T(E)-(E-E_{FA})/kT]$, moves to a lower energy with reduced temperatures. Moreover, it changes from components I and II at high temperatures ($T \geq 800K$) to IV at $T \leq 300$ K. The transition occurs at a temperature $T_c$ such that $$\frac{1}{kT_c} = c(E)\bigg|_{E=E_{FA}+\phi_0-\Delta E_C-qFx_D}, \quad (9a)$$

or $$T_c = \frac{qF}{k\alpha} \frac{1}{(\Delta E_C - qFx_D)^{1/2} - (\Delta E_C)^{1/2}} = \frac{2(\Delta E_C)^{1/2}}{k\alpha x_D}\left(1 + \frac{qFx_D}{4\Delta E_C} + ...\right), \quad (9b)$$

where $\alpha=4\pi\overline{2m^*}/h$ and $E=E_{FA}+\phi_0-\Delta E_C-qFx_D$ is the boundary between the energy regions for components III and IV. As $T_c=710$ K for $x_D=30$ Å (assuming $\phi_0=1.3$ eV, $\Delta E_C=0.9$ eV, and $m^*=m_e$) at zero field, and further increases with F or by reducing $x_D$, this suggests that component IV dominates the dark current of multilayer organic photodetectors with $x_D \leq 30$ Å at T<500 K.

To examine the electric field and temperature dependences of the injection current density, we obtain an approximation for the total current density (see Below), viz.:

$$J(F, T) = \frac{8\pi\sqrt{\pi} m^* q^2 FkT}{\alpha h^3} \sqrt{\frac{1}{kT} - \frac{1}{kT_c}} \exp\left\{-\frac{\phi_0 - \Delta E_C - qFx_D}{kT} + e_m\left(\frac{1}{kT} - \frac{1}{kT_c}\right)\right\} \times$$

$$\exp\left\{-\frac{2\alpha}{3qF}[(\Delta E_c + qFx_D)^{3/2} - (\Delta E_C)^{3/2}] - \frac{2\alpha}{3qF}e_m^{3/2}\right\}, \quad (10)$$

where $$e_m = E_{FA} + \phi_0 - \Delta E_C - qFx_D - E_m = \left[\frac{qF}{\alpha k}\left(\frac{1}{T} - \frac{1}{T_c}\right)\right]^2$$

is the energy difference between the PTCBI LUMO energy at $x=x_D$ and the dominant injection level ($E=E_m$). Except at intense electric fields and at very low temperatures, $0<e_m<<\phi_0$, $\Delta E_C$.

We derive the injection current density from the anode into an organic heterojunction with a potential profile $\phi_0(x)$ given by Eq. (8). As discussed above, component IV (FIG. 3) dominates the total injection current with $x_D$, $x_A \leq 30$ Å at T<500 K, and the dominant injection level at $E=E_m$ is determined by $c(E_m)=1/kT$ [Eq. (6)] with $E_m<E_{FA}+\phi_0-\Delta E_C-qFx_D$.

Substituting Eq. (8) into Eq. (5), we can obtain an explicit expression of $P_T(E)$ at $E-E_{FA}<\phi_0-\Delta E_C-qFx_D$, which leads to $$c(E) = \quad (A1)$$

$$\frac{d}{dE}\ln P_T(E) = \frac{\alpha}{qF}[(E_{FA} + \phi_0 - E)^{1/2} - (E_{FA} + \phi_0 - qFx_D - E)^{1/2} +$$

$$(E_{FA} + \phi_0 - \Delta E_C - qFx_D - E)^{1/2}],$$

where $\alpha=4\pi\overline{2m^*}/h$.

Denoting $$e_m = E_{FA} + \phi_0 - \Delta E_C - qFx_D - E_m, \quad (A2)$$

we have:

$$\frac{1}{kT} = c(E_m) = \frac{\alpha}{qF}[(\Delta E_C + qFx_D + e_m)^{1/2} - (\Delta E_C + e_m)^{1/2} + e_m^{1/2}] \approx \quad (A3)$$

$$\frac{\alpha}{qF}[(\Delta E_C + qFx_D)^{1/2} - (\Delta E_C)^{1/2} + e_m^{1/2}].$$

The approximation in Eq. (A3) is justified if $$\frac{qFx_D \cdot e_m^{1/2}}{(\Delta E_C)^{3/2}} << 1,$$

which can be satisfied except at very high fields or at very low temperatures. Thus, solving Eq. (A3) for $e_m$, we have $$e_m = \left\{\frac{qF}{\alpha kT} - [(\Delta E_C + qFx_D)^{1/2} - (\Delta E_C)^{1/2}]\right\}^2 = \left[\frac{qF}{\alpha k}\left(\frac{1}{T} - \frac{1}{T_c}\right)\right]^2, \quad (A4)$$

where $$T_c = \frac{qF}{k\alpha} \frac{1}{(\Delta E_C - qFx_D)^{1/2} - (\Delta E_C)^{1/2}} = \frac{2(\Delta E_C)^{1/2}}{k\alpha x_D}\left(1 + \frac{qFx_D}{4\Delta E_C} + ...\right).$$

Except at very low temperatures or at very high fields, $0<e_m<<\phi_0$, $\Delta E_C$.

Expanding $P_T(E)$ in the neighborhood of $E_m$, the current density now becomes:

$$J = \frac{4\pi m^* qkT}{h^3}\left(\frac{2\pi}{g_m}\right)^{1/2}\exp\left(-b_m - \frac{E_m - E_{FA}}{kT}\right), \quad (A5)$$

where $$b_m = \frac{2\alpha}{3qF}[(\Delta E_C + qFx_D + e_m)^{3/2} - (\Delta E_C + e_m)^{3/2} + e_m^{3/2}] \quad (A6)$$

$$\approx \frac{2\alpha}{3qF}[(\Delta E_C + qFx_D)^{3/2} - (\Delta E_C)^{3/2}] + \frac{e_m}{kT_c} + \frac{2\alpha}{3qF}e_m^{3/2},$$

and $$g_m = \frac{\alpha}{2qF}[(\Delta E_C + qFx_D + e_m)^{-1/2} - (\Delta E_C + e_m)^{-1/2} + e_m^{-1/2}] \quad (A7)$$

$$\approx \frac{\alpha}{2qF}e_m^{-1/2}.$$

Using A6 and A7, we obtain the injection current density given by Eq. (10).

The first term in the second exponent in Eq. (10) gives the tunneling probability at $E=E_{FA}+\phi_0-\Delta E_C-qFx_D$, which is independent of T and can be approximated as $$-\alpha(\Delta E_C)^{1/2}x_D\left(1 + \frac{qFx_D}{4\Delta E_C}\right),$$

whereas $\exp[-(\phi_0-\Delta E_C-qFx_D)/kT]$ gives the electron population in the anode at $E=E_{FA}+\phi_0-\Delta E_C-qFx_D$. Hence, neglecting the terms involving $e_m$ in Eq. (10), we see that: (i) a plot of ln(J/T) vs $T^{-1}$ gives the activation energy of the dark current:

$$E_{a,d} = \phi_0 - \Delta E_C - qFx_D, \quad (1)$$

which is linear with the electric field; and (ii) a plot of ln(J/F) vs F yields a straight line whose slope $$\frac{d\ln(J/F)}{dF} = \frac{qx_D}{kT} - \frac{\alpha x_D}{4} - \frac{qx_D}{(\Delta E_C)^{1/2}} \approx \frac{qx_D}{kT} - \frac{qx_D}{2kT_c} \quad (12)$$

is linear with respect to $T^{-1}$.

Now let:

$$F = -\gamma V_{PD}/t_{tot}, \quad (13)$$

where $V_{PD}$ is the applied voltage on the photodetector, $t_{tot}$ is the total thickness of the organic layers, and γ is a constant that relates the electric field to the fraction of voltage dropped across the photodetector active region. Then, Eqs. (11) and (12) become $$E_{a,d} = \phi_0 - \Delta E_C + \gamma q V_{PD} x_D/t_{tot}, \quad (14)$$

and $$\frac{d\ln(J/V_{PD})}{dV_{PD}} \approx -\frac{\gamma q x_D}{t_{tot}} \left( \frac{1}{kT} - \frac{1}{2kT_c} \right). \quad (15)$$

Devices have been constructed and example data recorded for exemplary embodiments of the present invention. The following examples of the invention are illustrative and not limiting of the invention.

EXAMPLES

Measurement Techniques

The photodetector current-voltage (I–V) characteristics in the dark were measured using an HP4145 semiconductor parameter analyzer. To measure the external quantum efficiency, a monochromatic beam of light chopped at 400 Hz was incident through the glass substrate. A calibrated Si photodetector (Newport 818 UV) was used to determine the light intensity. With the photodetector under reverse bias, the photocurrent was measured using a lock-in amplifier (Stanford₁Research SR830). For measurements at room temperature, the light from a Xe-arc lamp was incident on a 0.3 m monochrometer (Acton Research SpectraPro-300i), resulting in a beam intensity <0.2 mW/cm². The external quantum efficiency at room temperature was measured as a function of both wavelength (λ) and the applied bias ($V_{PD}$). A defocused He—Ne laser (λ=633 nm) beam with a spot size of ~1 mm and an intensity of ~10 mW/cm² was used as the light source for measurements at low temperatures. The sample was placed in a closed-cycle liquid He cryostat evacuated to 20 mTorr, where the temperature and voltage dependences of the dark current and photocurrent were measured over the temperature range of 20K≦T≦320K.

The surface morphologies of the ITO anodes were characterized in air using a Digital Instruments atomic force microscope operated in the tapping mode. UPS measurements were performed in a custom-designed UHV chamber (base pressure 1×10⁻¹⁰ Torr) equipped with a multichannel hemispherical VG CLAM4 electron energy analyzer. [Thermo VG Scientific, West Sussex, East Grinstead RH19 1UB, U.K.]. The UPS spectra were recorded using HeI excitation (hv=21.22 eV) from a VG UPS/2 source, with a pass energy of 2.5 eV. The work functions of various anodes were estimated from the secondary electron cutoff in the UPS spectra. [H. Ishii, K. Sugiyama, E. Ito, and K. Seki, Adv. Mater. 11, 605 (1999)]. The sample was biased at −3 V with respect to the analyzer to distinguish between the analyzer and sample cutoffs. The overall error for the work function determination was approximately 0.15 eV.

Example 1

Devices having the general structure ITO/(CuPc/PTCBI)$_N$/BCP 150 Å/Al 1000 Å were constructed. A 1500-Å-thick transparent, conducting ITO layer (sheet resistance ~30 Ω/□) commercially precoated on a glass substrate serves as the anode [Applied Film Corp., 6797-T Winchester Circle, Boulder, Colo. 80301]. The substrate was cleaned in boiling trichloroethylene, acetone and boiling isopropanol before being loaded into an ultrahigh vacuum (UHV) organic molecular beam deposition (OMBD)[S. R. Forrest, Chem. Rev. 97, 1793 (1997)] chamber with a base pressure of 1×10⁻¹ Torr. The active region of the photodetector consisting of alternating layers of CuPc and PTCBI was grown by OMBD at a rate of 0.3 to 0.4 Å/s at room temperature, followed by a 150-Å-thick BCP exciton-blocking layer. The thicknesses of the individual CuPc and PTCBI layers, $x_D$ and $x_A$, respectively, were varied from 15 Å to 240 Å, and the number of CuPc/PTCBI bilayer periods, N, was varied from 16 to 1 accordingly, to maintain the total thickness of the active region at N($x_D$+$x_A$)=480 Å. The notation ($x_D$/$x_A$)$_N$ represents the layer structure of the organic active region. The sample was then transferred to a separate vacuum chamber with a base pressure <1×10⁻⁶ Torr with minimal exposure to air, and a 1000-Å-thick Al cathode was deposited by thermal evaporation through a shadow mask. Two different electrode layouts were used; an unpatterned ITO anode with 1-mm-diameter cathodes was used for measurements at room temperature in ambient, and 2-mm-wide ITO stripes patterned by conventional photolithography with perpendicular 2-mm-wide cathode stripes were employed for measurements at low temperatures.

Figure 5:
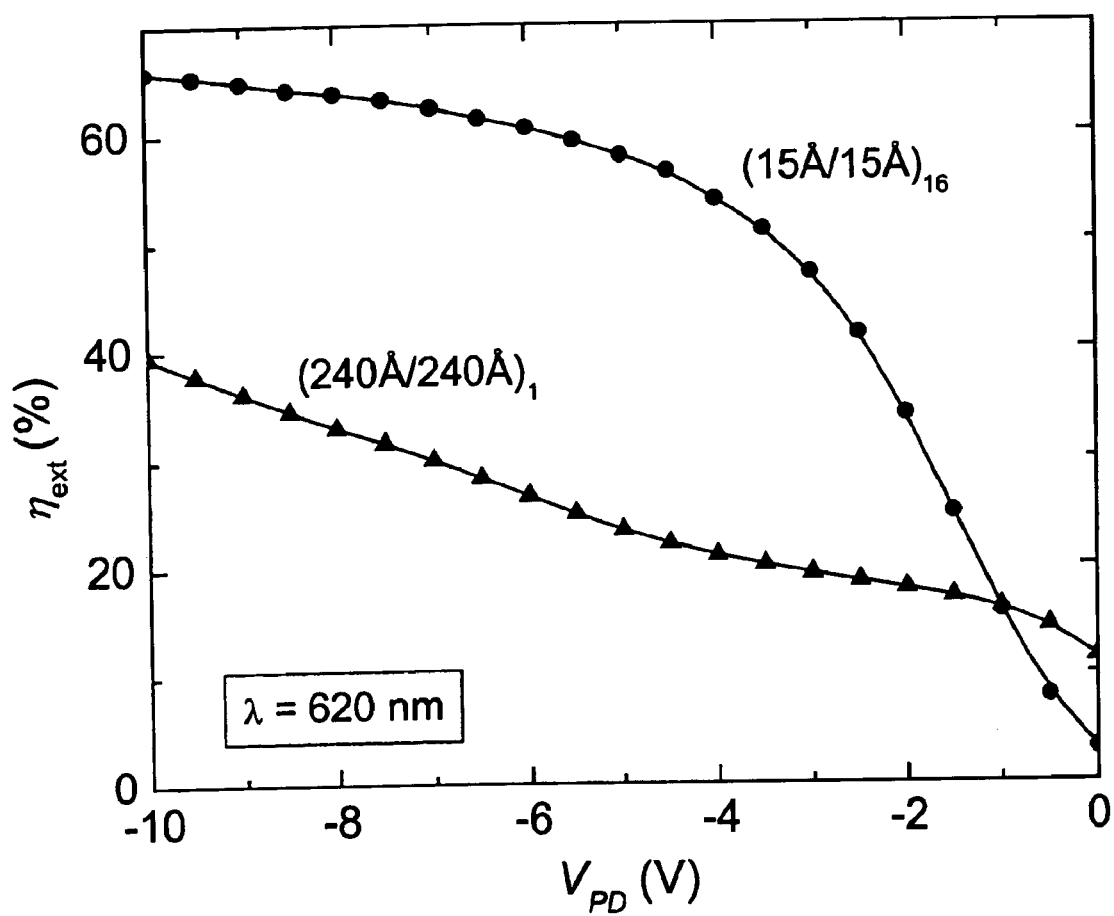
FIG. 5 shows the dependence of the external quantum efficiencies ($\eta_{ext}$) on applied bias ($V_{PD}$) at a wavelength of $\lambda$=620 nm for a multilayer and a bilayer photodetector with the structure of (15 Å/15 Å)$_{16}$ and (240 Å/240 Å)$_1$, respectively, in the organic active region.

FIG. 5 shows the dependence of the room-temperature external quantum efficiency, $\eta_{ext}$, at a wavelength of λ=620 nm on the applied bias, $V_{PD}$, for two photodetectors with organic active region structures: (240 Å/240 Å)$_1$ and (15 Å/15 Å)$_{16}$. For the (240 Å/240 Å)$_1$ "bilayer" photodetector, $\eta_{ext}$ is 12% at $V_{PD}$=0 V, and gradually increases to 40% as $V_{PD}$ approaches −10 V. For the (15 Å/15 Å)$_{16}$ photodetector, however, $\eta_{ext}$ changes rapidly from ≦3% to ≧50% as $V_{PD}$ is changed from 0 V to −4 V, and tends to saturate at $V_{PD}$≦−6 V. At $V_{PD}$=−10 V, $\eta_{ext}$=66±3%, which corresponds to $\eta_{int}$=80±5% as $\eta_{abs}$=83±3%. The transparency of the commercial ITO film, 87±2% at λ=620 nm, partially contributes to $\eta_{int}$ being short of 100%.

Figure 6:
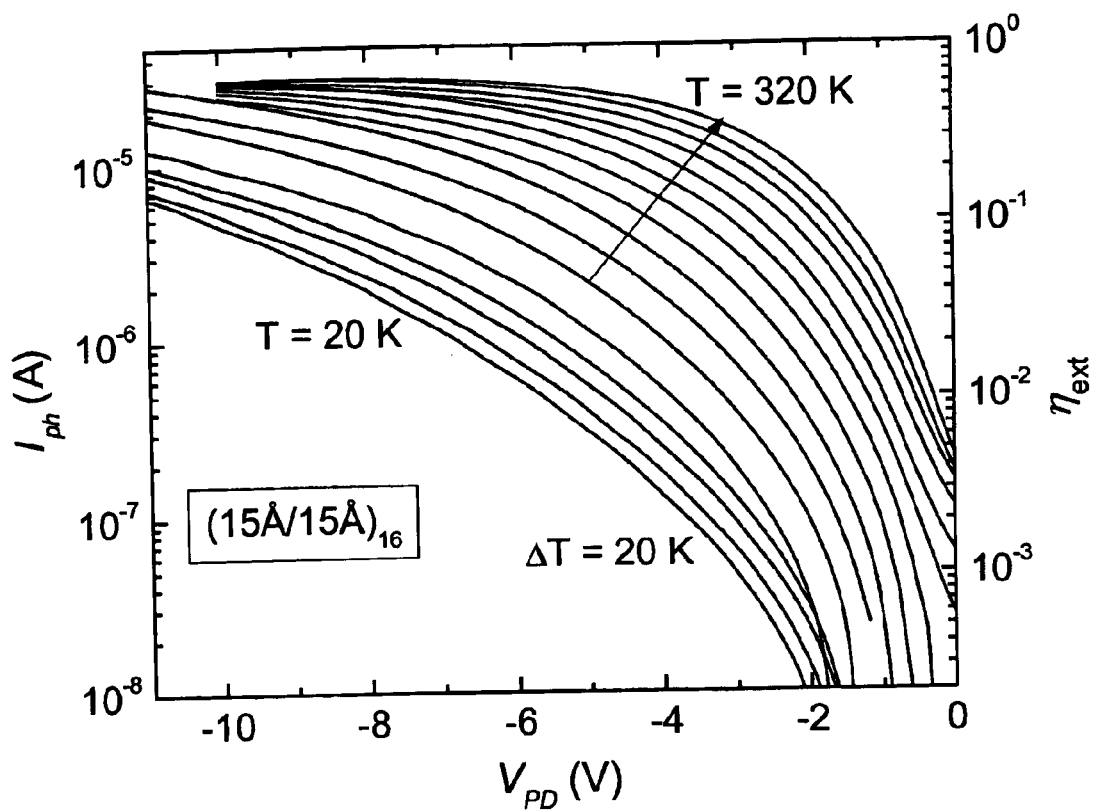
FIG. 6 shows the dependence of the photocurrent, $I_{ph}$, and the external quantum efficiency, $\eta_{ext}$, on applied bias $V_{PD}$ at 20K≦T≦320 K for a (15 Å/15 Å)$_{16}$ photodetector. The total intensity of the incident He—Ne laser excitation is (93±5) $\mu$W on a detector area of 4 mm$^2$.
Figure 7:
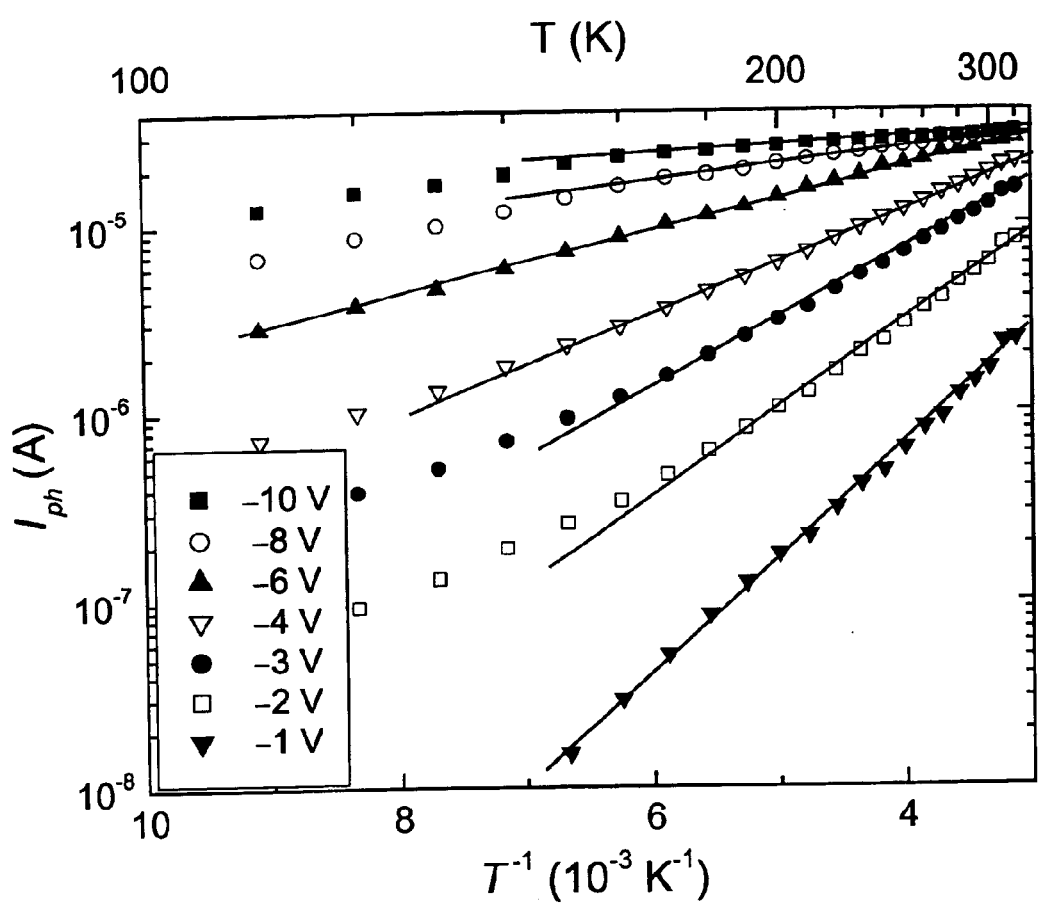
FIG. 7 shows the temperature dependence of the photocurrent at several reverse bias voltages. The symbols are experimental data with the corresponding $V_{PD}$ indicated in the legend, while the straight lines are fits to $\ln I_{ph}$ vs $T^{-1}$.

To explore whether the efficient extraction of photogenerated carriers from the potential wells in multilayer organic photodetectors with $x_D$, $x_A$≦30 Å is due to carrier tunneling through, rather than thermionic or thermionic-field emission over the intervening energy barriers arising from the HOMO and LUMO level offsets, we measured the temperature dependence of the photoresponse of multilayer photodetectors. FIG. 6 shows the photocurrent, $I_{ph}$, and the external quantum efficiency, $\eta_{ext}$, of a (15 Å/15 Å)$_{16}$ photodetector as a function of $V_{PD}$ over the temperature range of 20 K≦T≦320 K, while FIG. 7 is a semi-log plot of $I_{ph}$ vs $T^{-1}$ at several $V_{PD}$. At T~300 K, $I_{ph}$ (or $\eta_{ext}$) tends to saturate at $V_{PD}$<−6 V. As the temperature is lowered, higher reverse bias is needed to saturate $I_{ph}$, and eventually at T<160 K, the saturation of $I_{ph}$ is no longer observable even at $V_{PD}$=−11 V. On the other hand, at any given bias over the range −11 V≦$V_{PD}$≦0, $I_{ph}$ slowly decreases with temperature, suggesting a weakly thermally activated process. Furthermore, $I_{ph}$ has a weaker temperature dependence when the photodetector is subjected to a higher reverse bias. For example, from T=320 K to T=20 K, $I_{ph}$ is reduced by almost three orders of magnitude at $V_{PD}$=−2 V, whereas it is only reduced by approximately one order of magnitude at $V_{PD}$=−10 V. This indicates that the activation energy of the photocurrent depends on the reverse bias.

The different dependences of $\eta_{ext}$ on $V_{PD}$ in the multilayer and bilayer photodetectors shown in FIG. 5 can be attributed to differences in the exciton dissociation mechanisms present in these two devices. For multilayer photodetectors with $x_D$, $x_A$≦30 Å, as the exciton diffusion length is $L_D$~100 Å in CuPc and ~30 Å in PTCBI [P. Peumans, A. Yakimov, and S. R. Forrest, J. Appl. Phys. 93, 3693 (2003)], the dissociation efficiency $\eta_{ED}$ approaches 100%. The charge collection efficiency $\eta_{CC}$, however, is low at $V_{PD}$=0 V as the photogenerated carriers are trapped in the potential wells in the multilayer stack. In this case, an external electric field is needed to efficiently extract these photogenerated carriers, which leads to the initial rapid increase in $\eta_{ext}$ with increasing reverse bias.

In the bilayer photodetector, $\eta_{CC}$~100% as the photogenerated carriers are swept towards the opposing electrodes by the built-in electric field, leading to a much higher $\eta_{ext}$ at $V_{PD}$=0 V than in the multilayer device. The gradual increase in $\eta_{ext}$ with reverse bias is due to electric field-induced exciton dissociation in the bulk of the bilayer, which is described by Onsager geminate recombination, [E. A. Silinsh and V. Capek, *Organic molecular crystals: Interaction, localization, and transport phenomena* (Springer, New York, 1994)] and is increasingly important as the external electric field becomes stronger.

Figure 2:
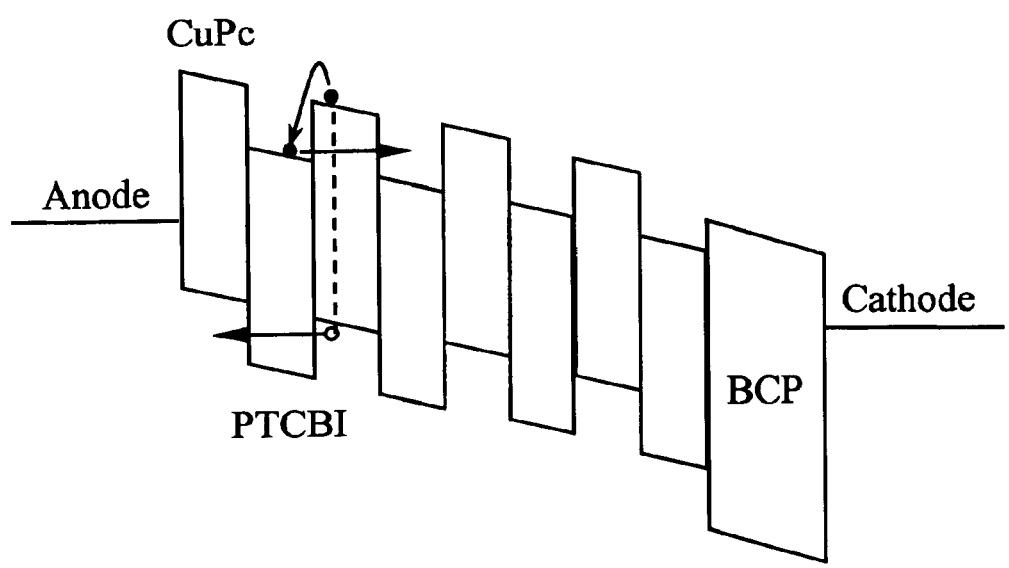
FIG. 2 shows a schematic energy level diagram of a photodetector under reverse bias, showing the highest occupied and lowest unoccupied molecular orbital (HOMO and LUMO) levels of the organic materials as well as the Fermi levels of the electrodes. Here, CuPc and PTCBI are the donor and acceptor materials forming the N-period stack in the active region, while BCP is the exciton blocking layer.
Figure 10:
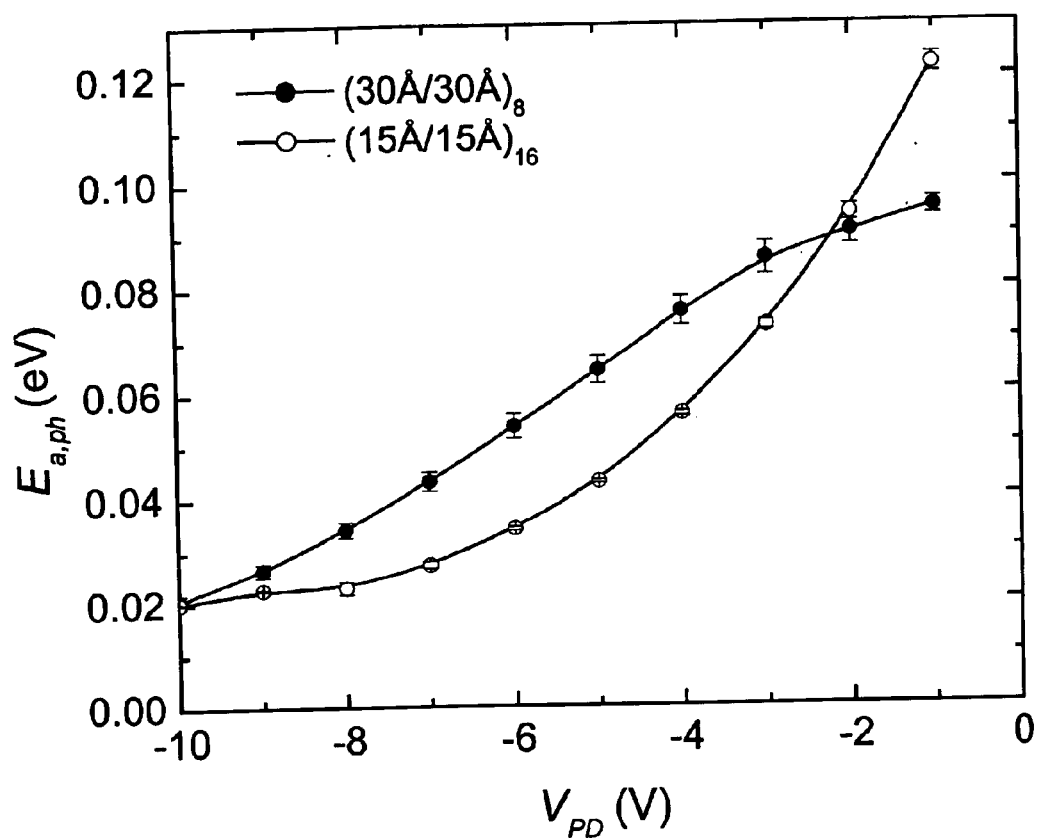
FIG. 10 shows the photocurrent activation energy, $E_{a,ph}$ for photodetectors with the structures $(15 \text{ Å}/15 \text{ Å})_{16}$ and $(30 \text{ Å}/30 \text{ Å})_8$.

In the multilayer photodetector, the HOMO and LUMO offsets between CuPc and PTCBI form potential wells trapping the photogenerated carriers [see FIG. 2]. The HOMO and LUMO level offsets between CuPc and PTCBI are both 0.9±0.1 eV. [I. G. Hill, D. Milliron, J. Schwartz, and A. Kahn, Appl. Surf. Sci. 166, 354 (2000); P. Peumans, V. Bulovic, and S. R. Forrest, Appl. Phys. Lett. 76, 2650 (2000)]. If the photogenerated carriers escape the potential wells via thermionic or thermionic-field emission, we would expect thermal activation of the photocurrent with a maximum characteristic energy, $E_{a,ph}$~0.9 eV. In FIG. 10, $E_{a,ph}$ is plotted as a function of $V_{PD}$ for photodetectors with active region structures of (15 Å/15 Å)$_{16}$ and (30 Å/30 Å)$_8$, obtained by linear fits of ln($I_{ph}$) versus T$^{-1}$ at T>150 K for the data in FIG. 7. Here, $E_{a,ph}$ decreases monotonically from ~0.1 eV at $V_{PD}$=−1 V to only 0.02 eV at $V_{PD}$=−10 V, with the detector with $x_D$=$x_A$=15 Å having a slightly lower activation energy.

The low $E_{a,ph}$ observed suggests that the photodetection process is only weakly thermally activated, which is contradictory to the expectations for the thermionic or thermionic-field emission mechanisms. Therefore, with $x_D$, $x_A$≦30 Å, the photogenerated carriers must escape from the potential wells by tunneling through the adjacent energy barrier. The residual weak thermal activation may be related to hopping-like exciton diffusion and/or the transport of the photogenerated charge carriers within the potential wells.

Figure 8:
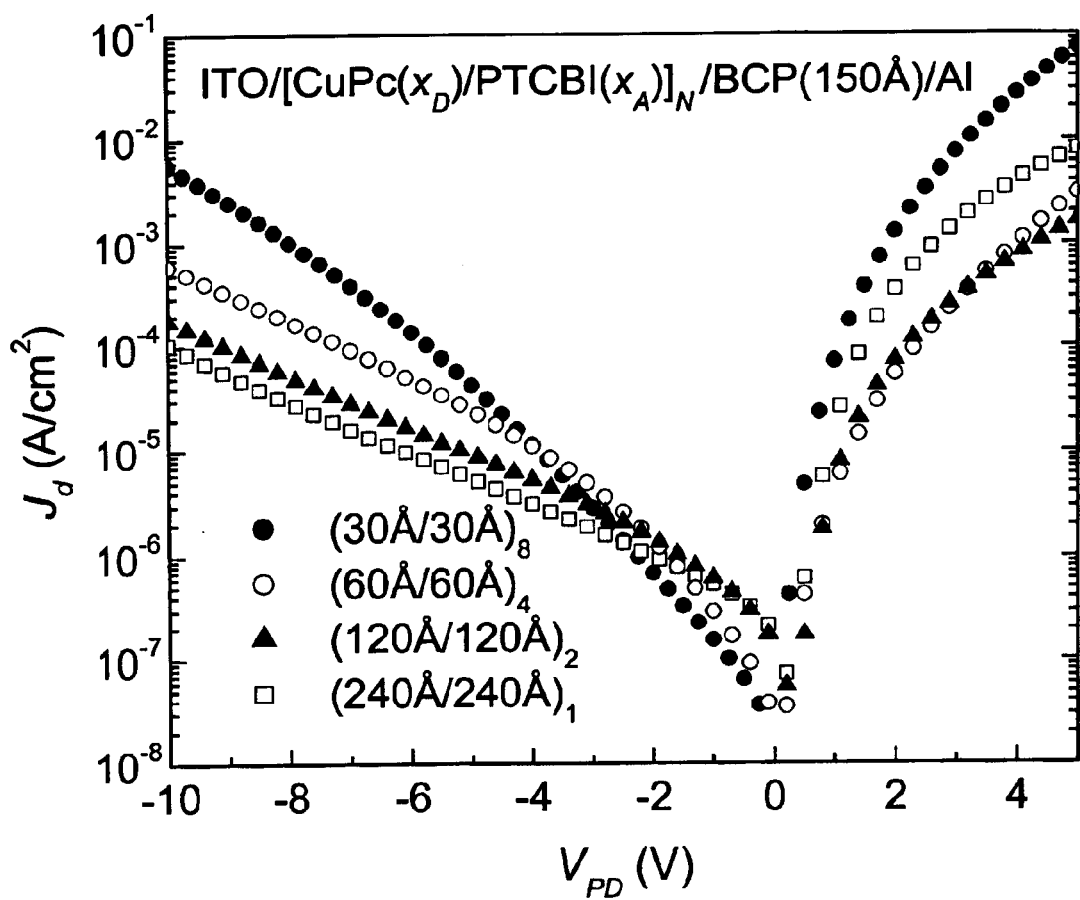
FIG. 8 shows the dependence of the room-temperature dark current density, $J_d$, on applied bias $V_{PD}$ of photodetectors with different active region structures.

FIG. 8 shows the room-temperature dark J–V characteristics for photodetectors with different organic active region structures. The detectors employ the same commercially deposited ITO anodes, and the thickness of the BCP layer is also the same (150 Å). For all detectors, the dark current density $J_d$ increases almost exponentially with the reverse bias, but more rapidly for detectors with thinner CuPc and PTCBI layers. From $V_{PD}$=−1 V to −10 V, $J_d$ of the (240 Å/240 Å)$_1$ detector increases from 0.5 $\mu$A/cm$^2$ to 0.1 mA/cm$^2$, or just over two orders of magnitude, whereas that of the (30 Å/30 Å)$_8$ detector increases from 0.1 $\mu$A/cm$^2$ to 5 mA/cm$^2$, or more than four orders of magnitude. Between −2 V<$V_{PD}$<0, the detectors with thinner CuPc or PTCBI layers have lower $J_d$ as compared with those with thicker layers. However, at $V_{PD}$<−4 V, $J_d$ increases significantly as the individual CuPc and PTCBI layers become thinner.

Figure 9:
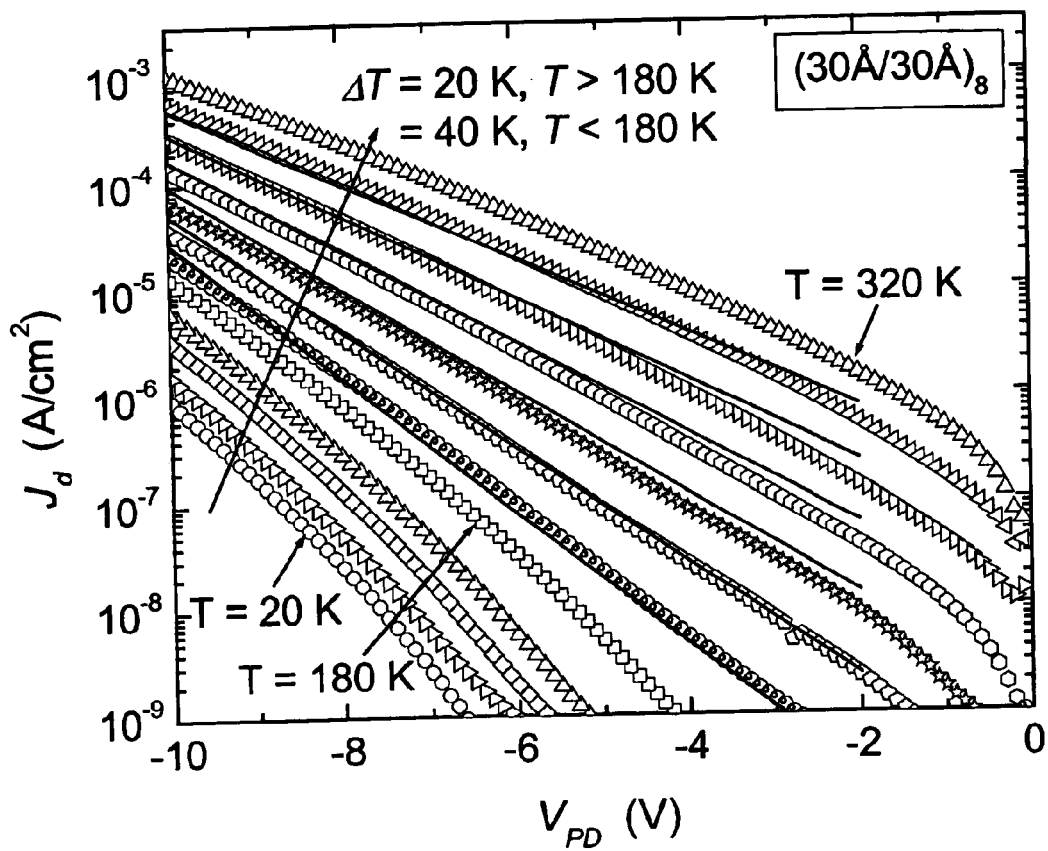
FIG. 9 shows the dark current density versus voltage characteristics of a $(30 \text{ Å}/30 \text{ Å})_8$ photodetector. Open symbols correspond to experimental data at $20 \text{ K} \leq T \leq 320 \text{ K}$ with a temperature interval of $\Delta T=20 \text{ K}$ at $T>180 \text{ K}$ and $\Delta T=40 \text{ K}$ at $T<180 \text{ K}$, while solid lines are numerical simulations at $200 \text{ K} \leq T \leq 300 \text{ K}$ ($\Delta T=20 \text{ K}$) using the following parameters: $\phi_0 - \Delta E_C = 0.42$ eV, $\Delta E_C = 0.93$ eV, $m^* = 0.72 \, m_e$, and $\gamma = 0.43$.

FIG. 9 shows the dark J–V characteristics (open symbols) for a (30 Å/30 Å)$_8$ photodetector over the temperature range 20 K≦T≦320 K with a temperature interval of ΔT=20 K at T>180 K and ΔT=40 K at T<180 K. A nearly linear dependence of ln$J_d$ on $V_{PD}$ can be observed for $V_{PD}$<−2 V and $J_d$>1 nA/cm$^2$. This dependence becomes stronger at lower temperatures, i.e., $$\frac{d\ln J_d}{d|V_{PD}|}$$

increases at reduced temperatures.

The voltage and temperature dependences of the dark current of a multilayer organic photodetector cannot be accurately described by a simple thermionic-field emission or Fowler-Nordheim tunneling. Above, we propose a semiclassical tunneling model to describe the electron injection current at the anode/organic interface, and find that electron tunneling injection into the first PTCBI LUMO well dominates the total injection current. Here, we show that the experimental data are consistent with electron tunneling injection as the dominant source of the dark current in photodetectors at T≧200K whose individual layers are ≦30 Å thick. Furthermore, the entire voltage and temperature dependences of the dark current can be fit by our model assuming reasonable values for the barrier heights between layers.

Figure 11:
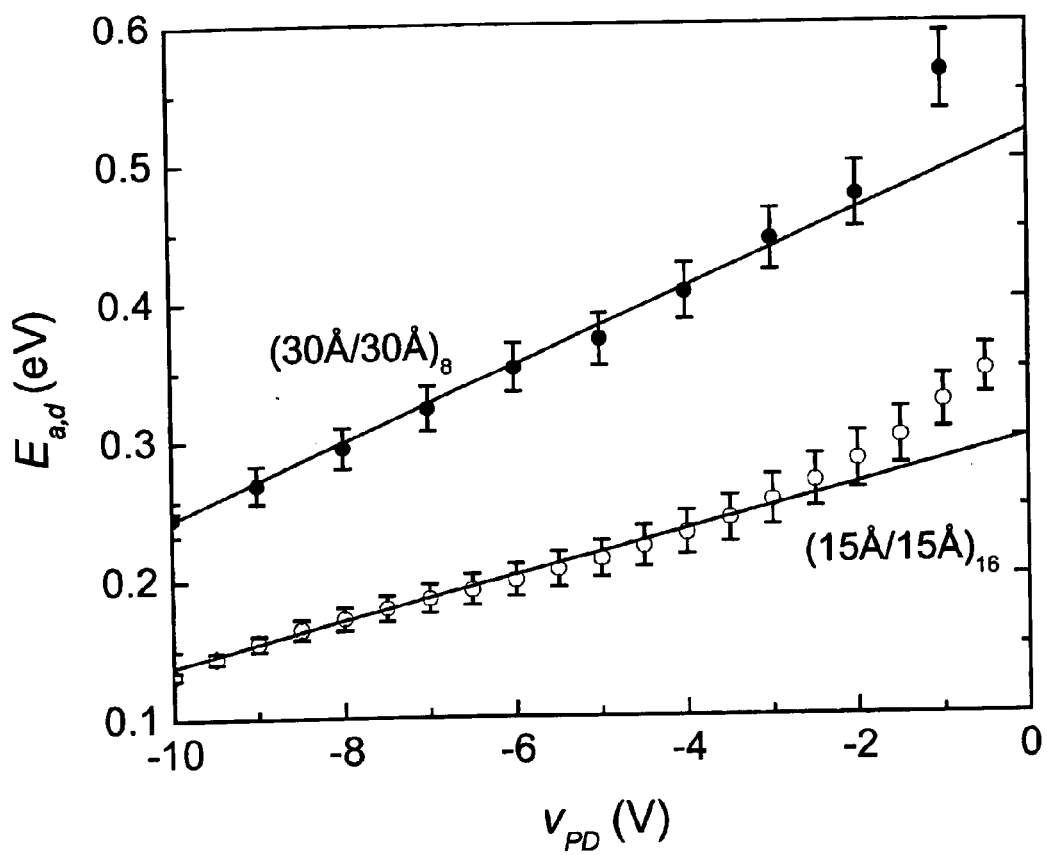
FIG. 11 shows the voltage dependence of the dark current activation energy, $E_{a,d}$, for two photodetectors in FIG. 10. The symbols represent results obtained by fitting the temperature dependence of the dark current $J_d$ at a given voltage according to $J_d/T = A \exp(-E_{a,d}/kT)$, where A is a constant. The straight lines are fits of $E_{a,d}$ vs $V_{PD}$ according to Eq. (16) in text. The data for the $(30 \text{ Å}/30 \text{ Å})_g$ photodetector are taken from FIG. 9.

The dark current activation energy, $E_{a,d}$, depends linearly on the applied bias [Eq. (14)]. As shown in FIG. 11, $E_{a,d}$ for (15 Å/15 Å)$_{16}$ and (30 Å/30 Å)$_8$ photodetectors, obtained by fitting the temperature dependence of $J_d$ according to $J_d$/T= Aexp(−$E_{a,d}$/kT) where A is a constant (see, for example, FIG. 9 for the (30 Å/30 Å)$_8$ photodetector), decreases almost linearly with increasing reverse bias. By fitting $E_{a,d}$ according to Eq. (14) at −10 V≦$V_{PD}$≦−3 V with $t_{tot}$=630 Å, we obtain $\phi_0$−Δ$E_C$=(0.30±0.04) eV and γ=0.68±0.06 for $x_D$=15 Å, and $\phi_0$−Δ$E_C$=(0.52±0.04) eV and γ=0.58±0.05 for $x_D$=30 Å.

Figure 12:
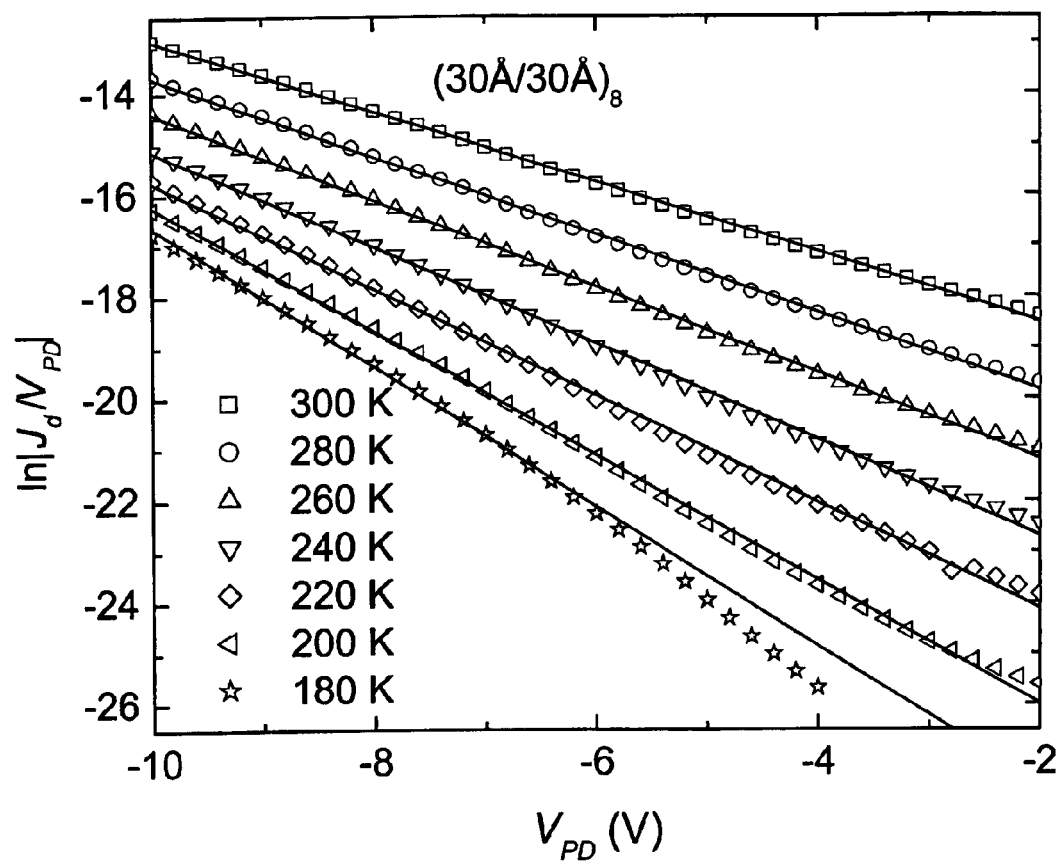
FIG. 12 shows the linear fits of $\ln|J_d/V_{PD}|$ vs $V_{PD}$ for the $(30 \text{ Å}/30 \text{ Å})_8$ photodetector in FIG. 9 at $180 \text{ K} \leq T \leq 300 \text{ K}$.
Figure 13:
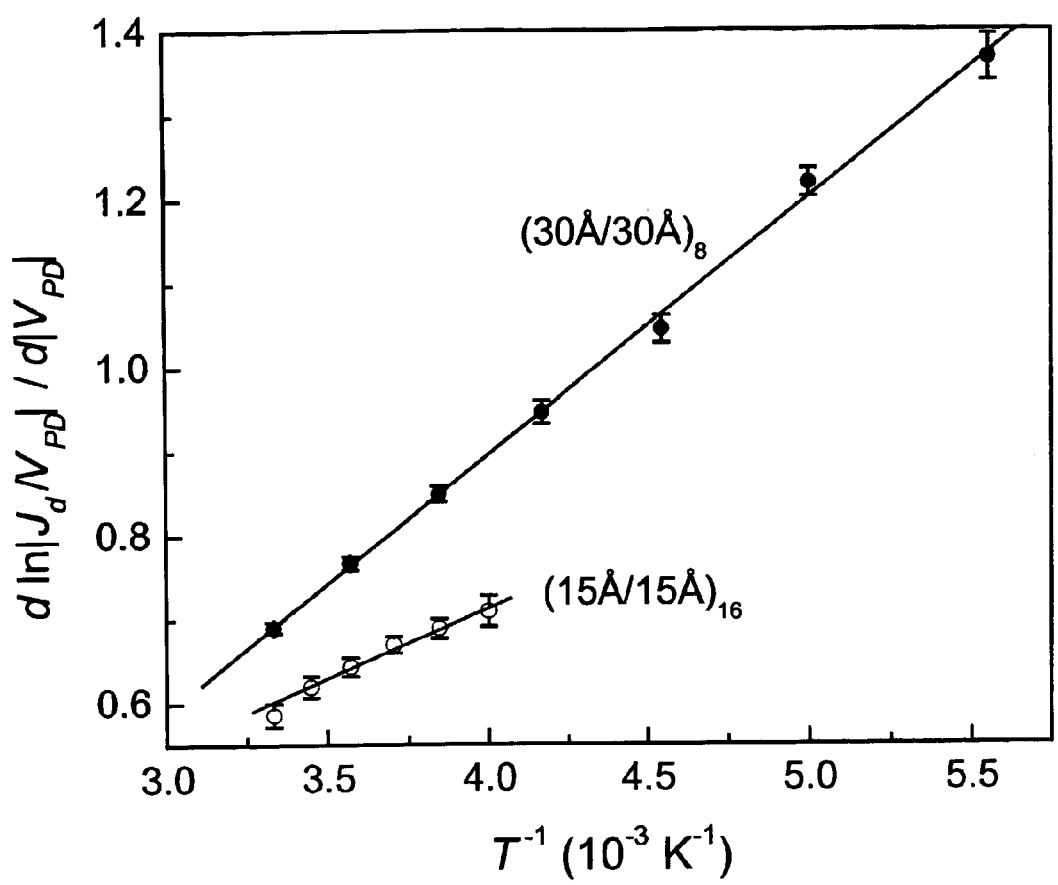
FIG. 13 shows the temperature dependence of $d\ln|J_d/V_{PD}|/d|V_{PD}|$. The filled circles are the slopes of the fits in FIG. 12, whereas the open circles are for a $(15 \text{ Å}/15 \text{ Å})_{16}$ photodetector obtained in a similar fashion. The straight lines in are fits according to Eq. (17).

The model also predicts ln|J/$V_{PD}$| is linear with $V_{PD}$ whose slope is linear with T$^{-1}$ [Eq. (15)]. As shown in FIG. 12, ln|$J_d$/$V_{PD}$| for the (30 Å/30 Å)$_8$ detector is indeed linear with $V_{PD}$ at 180 K≦T≦300 K, and fitting the slopes, or $$\frac{d\ln|J_d/V_{PD}|}{d|V_{PD}|},$$

vs. T$^{-1}$ yields γ=0.56±0.05 [see FIG. 13]. Also shown in FIG. 13 are the fitting results for the (15 Å/15 Å)$_{16}$ detector, which gives γ=0.60±0.08.

Numerical simulations according to Eqs. (4) and (7) with the potential profile $\phi(x)$ given in Eq. (8) are also used to fit the temperature dependent dark J–V characteristics for the (30 Å/30 Å)$_8$ photodetectors. In these fits, $\phi_0$−Δ$E_C$, Δ$E_C$, m*, and γ rare free parameters. As shown in FIG. 9, the numerical simulation (solid lines) with $\phi_0$−Δ$E_C$=0.42 eV, $\Delta E_C=0.93$ eV, $m^*=0.72$ $m_e$, and $\gamma=0.43$, reproduces the experimental (open symbols) voltage and temperature dependences of the dark current at $-10V \leq V_{PD} \leq -2V$ and at $200$ K$\leq$T$\leq 300$ K.

Table 1 summarizes the parameter values obtained for the (30 Å/30 Å)$_8$ photodetectors.

TABLE 1

| Fitting method | $\phi_0 - \Delta E_C$ (eV) | $\Delta E_C$ (eV) | $\phi_0$ (eV) | $m^*/m_e$ | $\gamma$ |
|---|---|---|---|---|---|
| $E_{a,d}$ vs $V_{PD}$ | $0.52 \pm 0.04$ | — | — | — | $0.58 \pm 0.05$ |
| $d\ln|J_d/V_{PD}|/dV_{PD}$ vs $T^{-1}$ | — | — | — | — | $0.56 \pm 0.05$ |
| $J_d$ vs $V_{PD}$, T | $0.42 \pm 0.02$ | $0.93 \pm 0.07$ | $1.35 \pm 0.09^a$ | $0.72 \pm 0.08$ | $0.43 \pm 0.04$ |
| Direct measurement | — | $0.9 \pm 0.1^b$ | $1.0 \pm 0.2^c$ | — | — |

$^a$Calculated from the fitting results of $\phi_0 - \Delta E_C$ and $\Delta E_C$.
$^b$From UPS measurements in I. G. Hill, D. Milliron, J. Schwartz, and A. Kahn, Appl. Surf. Sci. 166, 354 (2000).
$^c$From UPS measurements in I. G. Hill and A. Kahn, J. Appl. Phys. 86, 2116 (1999).

First, the HOMO level offset between CuPc and PTCBI is measured at $(0.9\pm0.1)$ eV [I. G. Hill, D. Milliron, J. Schwartz, and A. Kahn, Appl. Surf. Sci. 166, 354 (2000)], which, combined with measured optical gaps of $(1.7\pm0.1)$ eV for both CuPc and PTCBI [P. Peumans, V. Bulovic, and S. R. Forrest, Appl. Phys. Lett. 76, 2650 (2000)], yields a LUMO level offset of $\Delta E_C=(0.9\pm0.1)$ eV. This agrees with our result of $\Delta E_C=(0.93\pm0.07)$ eV as obtained by fitting $J_d$ versus ($V_{PD}$, T).

Second, UPS studies show a barrier height of $0.7\pm0.1$ eV for hole injection from ITO (solvent-cleaned only) to CuPc [I. G. Hill and A. Kahn, J. Appl. Phys. 86, 2116 (1999)], yielding a barrier height of $\phi_0=(1.0\pm0.2)$ eV for electron injection from ITO to CuPc. This also leads to $\phi_0-\Delta E_C=(0.1\pm0.3)$ eV, which is the barrier height for electron injection from ITO into the PTCBI LUMO at zero bias. Both barrier heights are 0.3 to 0.4 eV lower than our fitting results of $\phi_0=(1.35\pm0.09)$ eV and $\phi_0-\Delta E_C\sim 0.4$ to $0.5$ eV. The difference is attributed to the underestimation of the transport gaps (the minimum energy for forming a pair of a separated free electron and hole) of the organic materials, using instead the optical gaps (the onset of optical absorption). This implies that the LUMO levels are actually located at higher energies than are inferred from the sum of the HOMO energies plus the optical gaps. Indeed, the transport gap in CuPc is $(0.6\pm0.4)$ eV larger than the optical gap, found using a combination of UPS and inverse photoelectron spectroscopy [I. G. Hill, A. Kahn, Z. G. Soos, and Jr. R. A. Pascal, Chem. Phys. Lett. 327, 181 (2000)], suggesting close agreement with our dark current analysis.

Next, $m^*=2.2$ $m_e$ was estimated for hot electrons in oriented CuPc films from low-energy-electron transmission spectra [N. Ueno, K. Sugita, and T. Shinmura, Phys. Rev. B 44, 6472 (1991)]. However, it is difficult to draw a comparison with our fitting results of $m^*=(0.72\pm0.08)$ $m_e$. The values for $\gamma$ as obtained by different fitting methods are in fair agreement with each other. However, it is unclear why $\gamma<1$, or why $\gamma$ is larger in detectors with smaller $x_D$. Nevertheless, this suggests that a significant voltage drop occurs outside the organic active region, most possibly across the exciton-blocking layer.

Finally, the agreement between the simulated and experimental dark current densities indicates that electron tunneling at the anode/CuPc interface dominates the dark current in photodetectors with $x_D$, $x_A \leq 30$ Å at T$\geq 200$ K. For detectors with thicker CuPc and PTCBI layers, the generation current in the depleted organic layers becomes important. At T<150 K, the simulated dark current is significantly lower than the experimental results. In fact, experimentally the dark current density shows a significantly reduced activation energy at low temperatures. This is attributed to other thermally assisted tunneling mechanisms such as through defect states in the energy gaps of the organic materials.

By measuring the quantum efficiency of multilayer organic photodetectors with individual organic layer thicknesses $\leq 30$ Å, we observe a photocurrent activation energy $\leq 0.1$ eV. Such a weak temperature dependence suggests that the photogenerated charge carriers escape the potential wells formed in the organic multilayer stack via tunneling across the donor-acceptor interfaces. On the other hand, electron tunneling injection from the ITO anode into the organic active region dominates the dark current at T$\geq 200$ K. Fitting of the experimental dark J–V characteristics using numerical simulations based on a semi-classical tunneling model yield a LUMO level offset between CuPc and PTCBI of $(0.93\pm0.07)$ eV and a barrier height for electrons at the ITO/CuPc interface of $(1.35\pm0.08)$ eV, both in agreement with independently obtained experimental data.

To achieve a high quantum efficiency and a high speed of response, individual layers in the active region must be thin enough for photogenerated carriers to tunnel through the adjacent barriers, and ultimately be collected at the electrodes. An anode with a high work function may be used to reduce the tunneling current of electrons from the anode into the organic layers, thereby lowering the dark current under reverse bias. This can be accomplished, for example, by inserting a thin layer of an organic material between the anode and the first donor (i.e., CuPc) layer, or by increasing the work function of the anode itself. Alternatively, other material systems can be used to maximize $\phi_0-\Delta E_C$ while maintaining a sufficiently large HOMO/LUMO offset for favorable exciton dissociation at the organic heterointerfaces. Numerical simulations show that the electric field in the first CuPc and PTCBI layers is less than the average field across the entire device, which indicates a significant voltage drop occurs outside the detector active region, most possibly in the BCP exciton-blocking layer.

Example 2

Devices having the general structure ITO/(CuPc/PTCBI)$_N$/BCP 150 Å/Al 1000 Å were constructed. The active region, disposed between an ITO anode and a metal cathode, consists of alternating layers of donor-like CuPc and acceptor-like 3,4,9,10-PTCBI, with the first CuPc layer in contact with the anode. A 150-Å-thick layer of BCP was deposited on top of the active region to serve as an exciton blocking layer. All the organic layers were deposited by the ultrahigh vacuum (UHV) process of organic molecular beam deposition (OMBD) at a rate of 0.3 to 0.4 Å/s at room temperature. The 1000-Å-thick Al cathode was deposited by thermal evaporation through a shadow mask with 1 mm diameter openings in a separate vacuum chamber with a base pressure of <1×10$^{-6}$ Torr.

Two types of ITO films were used as the anodes of multilayer organic photodetectors: 1500-Å-thick ITO films with a sheet resistance of ~30 Ω/□ commercially precoated on glass substrates [Applied Film Corp., 6797-T Winchester Circle, Boulder, Colo. 80301], or 1000-Å-thick ITO films deposited on clean glass substrates by rf magnetron sputtering at room temperature. Two vacuum chambers with different geometries [G. Gu, V. Bulovic, P. E. Burrows, S. R. Forrest, and M. E. Thompson, Appl. Phys. Lett. 68, 2606 (1996); G. Gu, G. Parthasarathy, P. E. Burrows, P. Tian, I. G. Hill, A. Kahn, and S. R. Forrest, J. Appl. Phys. 86, 4067 (1999)], both having a base pressure <2×10$^{-8}$ Torr, were used to sputter-deposit the ITO films. The targets in both chambers, housed in the magnetron guns, were composed of 10% $SnO_2$ and 90% $In_2O_3$ by weight with 99% purity. The sputtering gas was 99.9999% pure Ar. In one chamber (A), the target was mounted parallel to and 15 cm below the stationary substrate holder, whereas in the other chamber (B), the target faced the rotating substrate holder 25 cm away at a 45° tilt angle. Both the substrate holders and the targets were water-cooled. Glass substrates were cleaned in ultrasonic baths of acetone and isopropanol, followed by blowing dry in $N_2$. The ITO films were sputter-deposited in Chamber A using 10 W rf power at a process pressure of 5 mTorr and a 200 sccm Ar flow, or in Chamber B using 75 W rf power at 2 mTorr and a 140 sccm Ar flow. Film thicknesses were monitored by quartz crystal microbalances positioned close to the substrate holders.

The ITO-coated glass substrates were cleaned in boiling trichloroethylene, acetone and boiling isopropanol. Certain surface treatments were applied to some samples before the untreated (solvent cleaned) and treated substrates were loaded into a vacuum chamber together for the deposition of the organic photodetector layers. For the oxygen plasma treatment, the substrates were exposed for 10 min to an oxygen plasma in a parallel plate geometry, at a chamber pressure of 100 mTorr, an oxygen flow of 100 sccm and an rf power of 50 W corresponding to a power density of ~100 mW/cm$^2$. For UV-ozone treatment, the ITO was exposed for 10 min with a 5 cm distance between the samples and a 20 W UV lamp.

A 500-Å-thick layer of 4,4',4''-tris(3-methyl-phenyl-phenyl-amino)triphenylamine (MTDATA) p-doped [J. Drechsel, M. Pfeiffer, X. Zhou, A. Nollau, and K. Leo, Synth. Met. 127, 201 (2002)] with 2 mol % tetrafluoro-tetracyano-quinodimethane ($F_4$-TCNQ), deposited by thermal evaporation in a high vacuum chamber with a base pressure <1×10$^{-7}$ Torr, was also used to coat the untreated ITO films. This layer is highly conductive and transparent in the visible spectral region. Since the ionization potential of MTDATA is 5.1±0.1 eV [P. Peumans, V. Bulovic, and S. R. Forrest, Appl. Phys. Lett. 76, 2650 (2000)] and the Fermi level in MTDATA doped with 2 mol % $F_4$-TCNQ is 0.2±0.1 eV above the MTDATA highest occupied molecular orbital (HOMO), the presence of doped MTDATA increases the anode work function to 4.9±0.2 eV.

Figure 14:
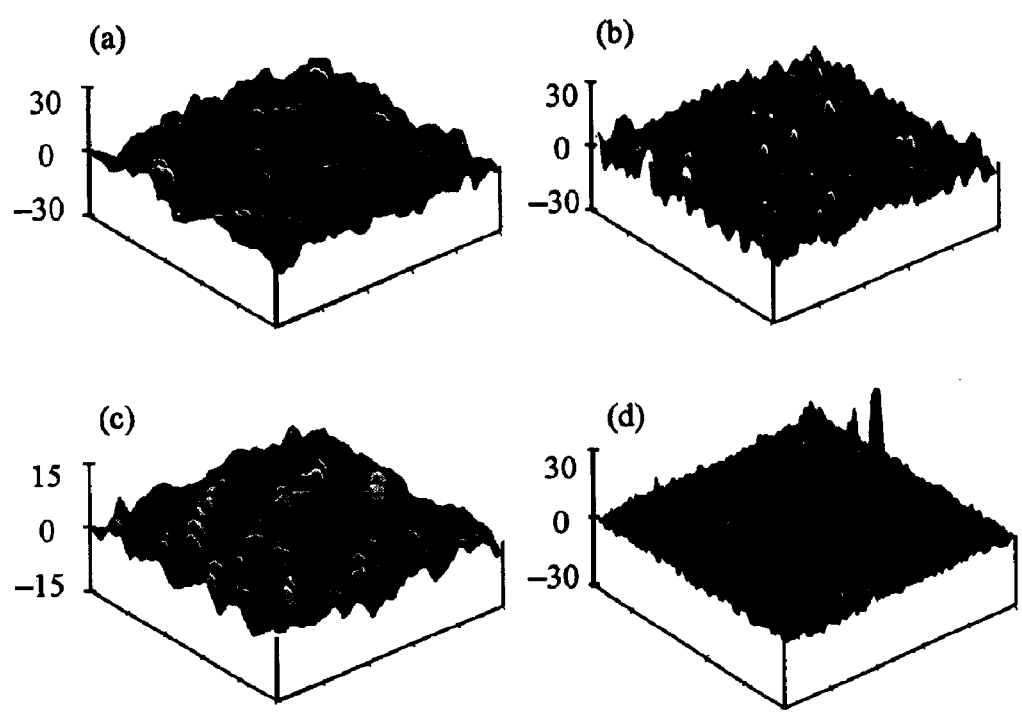
FIG. 14 shows atomic force microscope images of various ITO anodes: (a) untreated commercial ITO, (b) untreated sputtered ITO, (c) commercial ITO coated with a p-doped MTDATA layer, and (d) sputtered ITO coated with MTDATA. The height scale in each image is in nm, whereas the scan size is 1 $\mu$m×1 $\mu$m except in (d), where it is 5 $\mu$m×5 $\mu$m.

FIG. 14 shows AFM topographical images of several ITO anodes, with the grain sizes and measured root-mean-square (rms) roughnesses listed in Table 2.

TABLE 2

| ITO anode | Grain size (nm) | RMS roughness (nm) | Work function (eV) |
|---|---|---|---|
| Commercial, untreated | 30–100 | 3.2 ± 0.4 | 4.31 ± 0.15 |
| Commercial, oxygen plasma treated | ~120 | 3.7 ± 0.4 | 4.80 ± 0.15 |
| Commercial, UV ozone treated | — | — | 4.78 ± 0.15 |
| Commercial, MTDATA-coated | 50–100 | 2.9 ± 0.4 | — |
| Sputtered,[a] chamber A, untreated | — | — | 4.15 ± 0.15 |
| Sputtered,[a] chamber B, untreated | 50–80 | 1.2 ± 0.2[b] | 4.03 ± 0.15 |
| Sputtered,[a] chamber B, oxygen plasma | ~80 | 1.4 ± 0.2[b] | 4.75 ± 0.15 |
| Sputtered,[a] chamber B, UV ozone | — | — | 4.73 ± 0.15 |
| Sputtered,[a] chamber B, MTDATA-coated | 50–80 | 1.0 ± 0.2[b] | — |

[a]All sputtered films were 100 nm thick.
[b]Root-mean-square (RMS) roughness is estimated from areas without any spikes.

As shown in FIG. 14(a), the untreated commercial ITO film surface exhibits clustered grains with diameters of 30–100 nm, and an rms roughness of 3.2±0.4=n. The 100 nm thick ITO film deposited at room temperature in chamber B using rf magnetron sputtering, shown in FIG. 14(b), shows grain sizes of 50–80 nm, not significantly different from the untreated commercial ITO film; however, the sputtered ITO film is much smoother, with an rms roughness of only 1.2±0.2 nm. Oxygen plasma treatment results in a slight increase in both the roughness and grain size for the commercial ITO film (see Table 2), whereas no significant influence on the surface morphology of sputtered ITO film was observed. Coating the untreated commercial or sputtered ITO film with a 500 Å thick layer of MTDATA doped with $F_4$-TCNQ produces an organic surface nearly replicating the ITO surface, as shown in FIGS. 14(c) and 14(d), with only a slight decrease in the rms roughness (see Table 2). "Spikes" with diameters of ~300 nm and heights of 20–30 nm can be seen at some locations on the MTDATA-oated sputtered ITO film surface (FIG. 14(d)) as well as on the uncoated sputtered ITO film surface (not shown) when a larger area (5 μm×5 μm) on the surface was explored, while similar features were not observed on any commercial ITO films. We attribute these spikes to particles buried in the films during the sputtering process.

Figure 15:
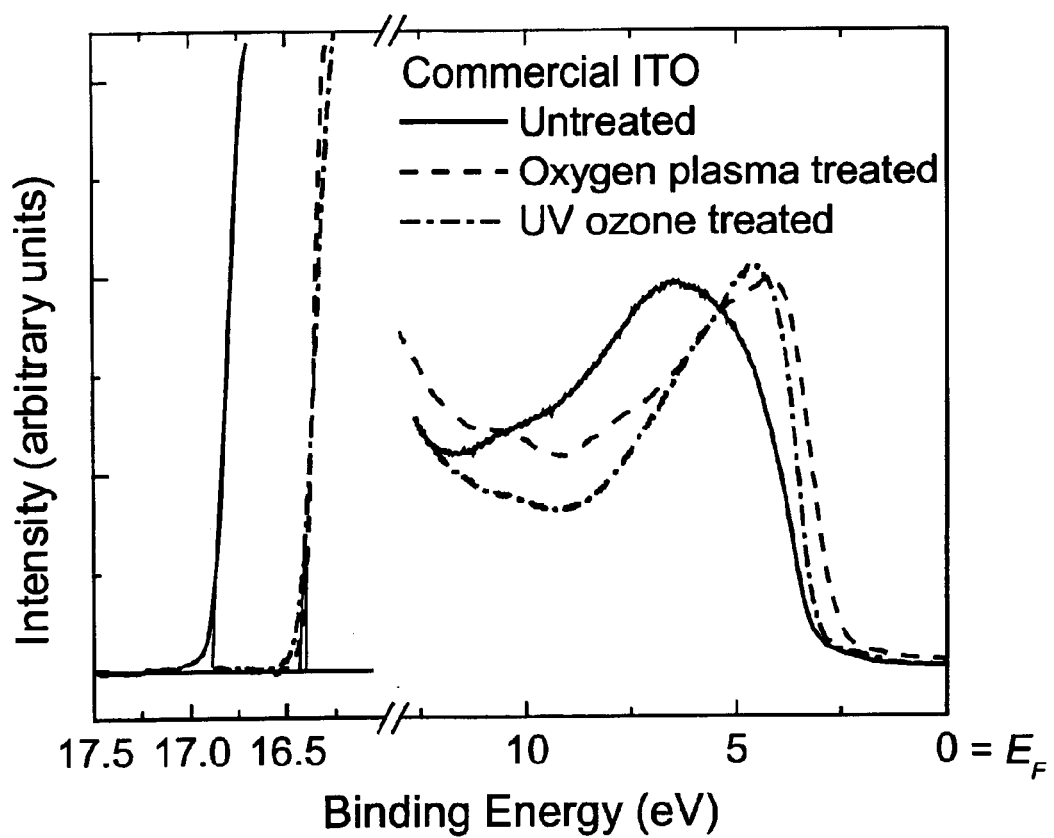
FIG. 15 shows the ultraviolet photoemission spectra of commercial ITO films that are untreated, oxygen plasma treated, or UV-ozone treated. He I (hv=21.22 eV) emission was used as the excitation source. Shifts in the secondary electron cutoff (at the high binding energy portion of the spectra) towards lower binding energies correspond to increases in the ITO work function. The Fermi energy is $E_F$.
Figure 16:
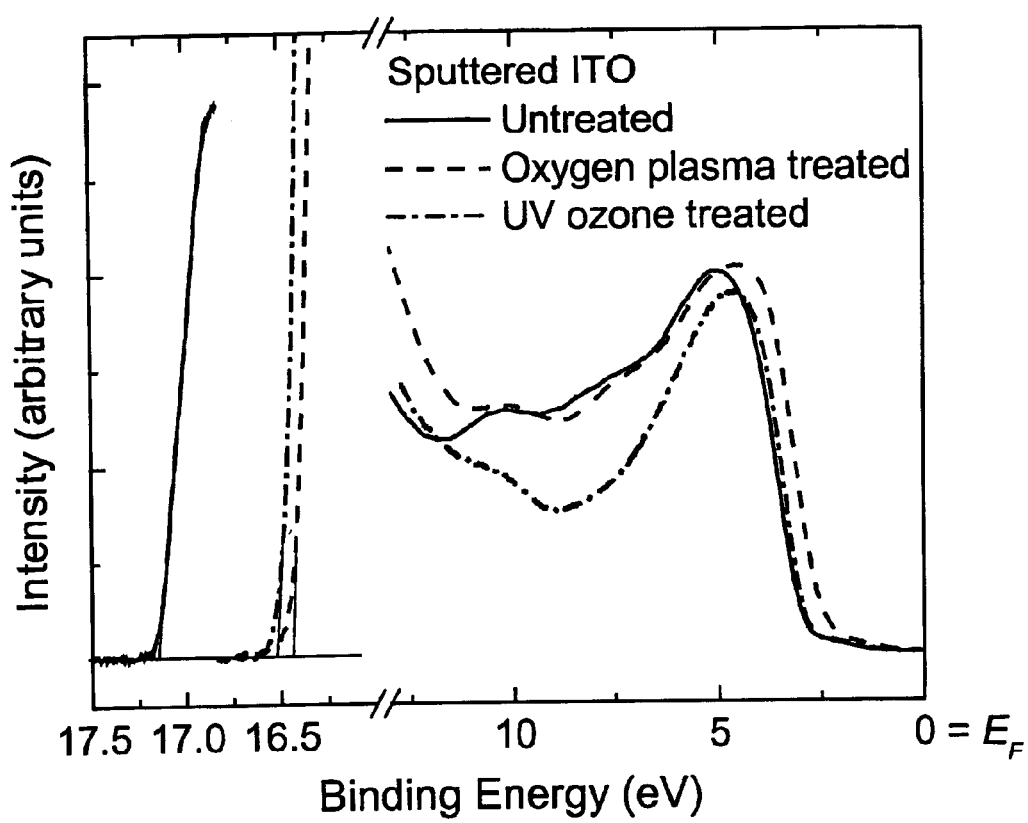
FIG. 16 shows the ultraviolet photoemission spectra of sputtered ITO films (ITO sputtered in chamber B at room temperature, 75 W rf power, 2 mTorr, 140 sccm Ar flow) that are untreated, oxygen plasma treated, or UV-ozone treated. He I (hv=21.22 eV) emission was used as the excitation source. Shifts in the secondary electron cutoff (at the high binding energy portion of the spectra) towards lower binding energies correspond to increases in the ITO work function. The Fermi energy is $E_F$.

FIGS. 15 and 16 show UPS spectra of commercial (FIG. 15) and sputtered (FIG. 16) ITO films with and without surface treatment. The secondary electron cutoff is taken as the intercept between the background level and the extrapolation of the leading edge in the high binding energy region of the UPS spectrum. The work function is then obtained by subtracting the binding energy at the cutoff from the photon energy. The work function of each ITO anode, averaged over three different locations on the sample surface, is listed in Table 2. The untreated commercial ITO film has a work function of W=(4.31±0.15) eV. With either oxygen plasma or UV-ozone treatment applied to the surface, the secondary electron cutoff in the UPS spectrum shifts towards a lower binding energy, as shown in FIG. 16, corresponding to an increase of ~0.5 eV in W. The work function of the oxygen plasma or UV-ozone treated commercial ITO film, ~4.8 eV, is in good agreement with previous reports.

For the ITO film deposited by rf magnetron sputtering in Chamber B at room temperature, the work function of the as-sputtered film is W=(4.03±0.15) eV, approximately 0.3 eV lower than that of an untreated commercial ITO film. Sputtering in Chamber A produces ITO films with a ~0.1 eV higher work function (see Table 2), although it is still ≧0.15 eV lower than that of an untreated commercial ITO film. The difference in the work function of ITO films sputtered in different chambers is attributed to differences in the sputtering conditions and chamber geometries. On the other hand, oxygen plasma or UV-ozone treatment on the sputtered films can also increase W by ~0.7 eV, as shown in FIG. 16. In fact, the treated sputter-deposited ITO films have almost identical work functions as the treated commercial ITO films (see Table 2).

Although the oxygen plasma and V-ozone treatments can increase the work function of ITO films by similar amounts, significant differences can be seen in the low binding energy portion (top of the valence band) of the UPS spectra shown in FIGS. 15 and 16. Besides the obvious differences in peak shapes, the oxygen plasma treatment causes the valence band maximum to shift towards a lower binding energy by 0.6 eV or 0.5 eV for the commercial or sputtered ITO, respectively, whereas the UV-ozone treatment leads to a ≦0.1 eV shift for both the commercial and sputtered ITO. More work is needed to identify the exact physical and/or chemical origin of these energy shifts.

Figure 17:
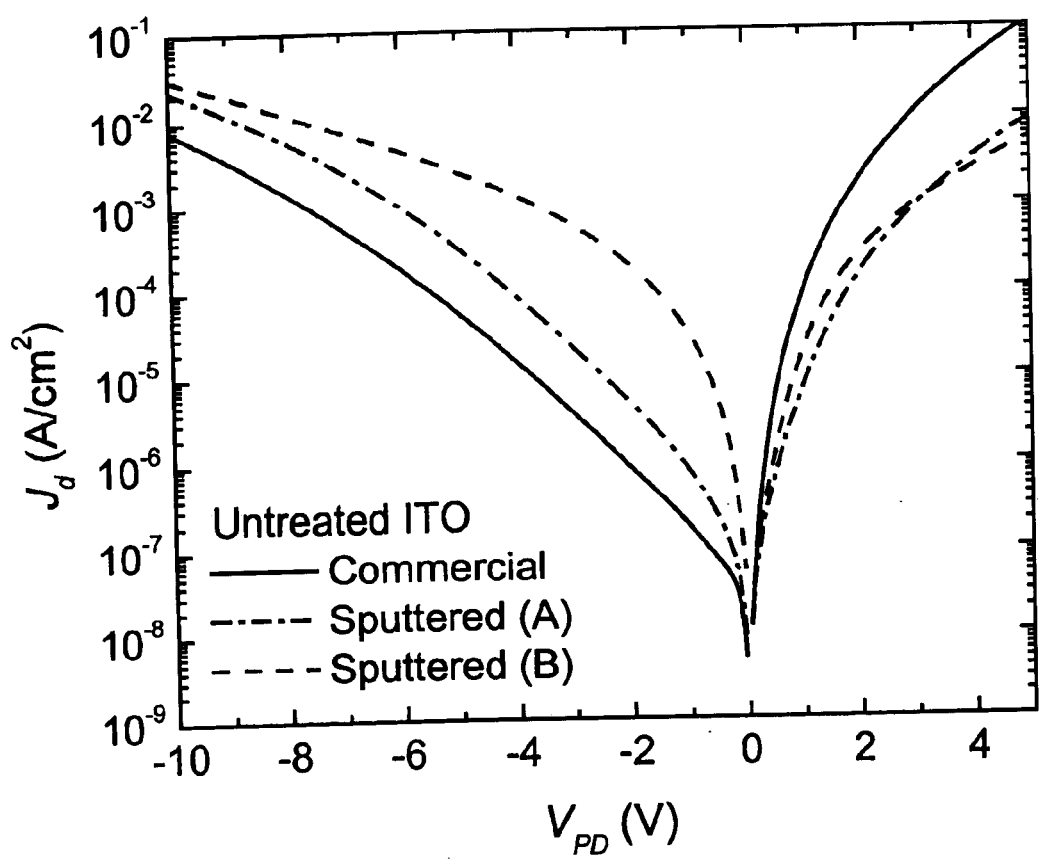
FIG. 17 shows the comparison of dark current density ($J_d$) versus voltage ($V_{PD}$) characteristics for multilayer organic photodetectors fabricated on an untreated ITO anode, either commercially obtained or rf magnetron sputtered in chamber A or B. The photodetectors have the same layer structure in the organic active region with eight periods of 30 Å thick CuPc and 30 Å thick PTCBI, denoted as $(30 \text{ Å}/30 \text{ Å})_8$.

FIG. 17 shows the dependence of the dark current density, $J_d$, on the applied bias, $V_{PD}$, of multilayer organic photodetectors fabricated on three untreated ITO anodes. The three photodetectors have the same layer structure in the organic active region with eight periods of 30 Å thick CuPc and 30 Å thick PTCBI, denoted (30 Å/30 Å)$_8$. Under forward bias, the photodetector with an untreated commercial ITO anode has an approximately one order of magnitude higher dark current density at $V_{PD}>1$ V compared with photodetectors with untreated ITO films sputtered in either chamber A or B. However, among the three photodetectors, the one with the commercial ITO anode has the lowest dark current under reverse bias. Moreover, although the two photodetectors with sputtered ITO anodes have similar J–V characteristics under forward bias, the one with ITO sputtered in chamber B has a higher $J_d$ under reverse bias, particularly at $-5$ V<$V_{PD}$<0.

Figure 18:
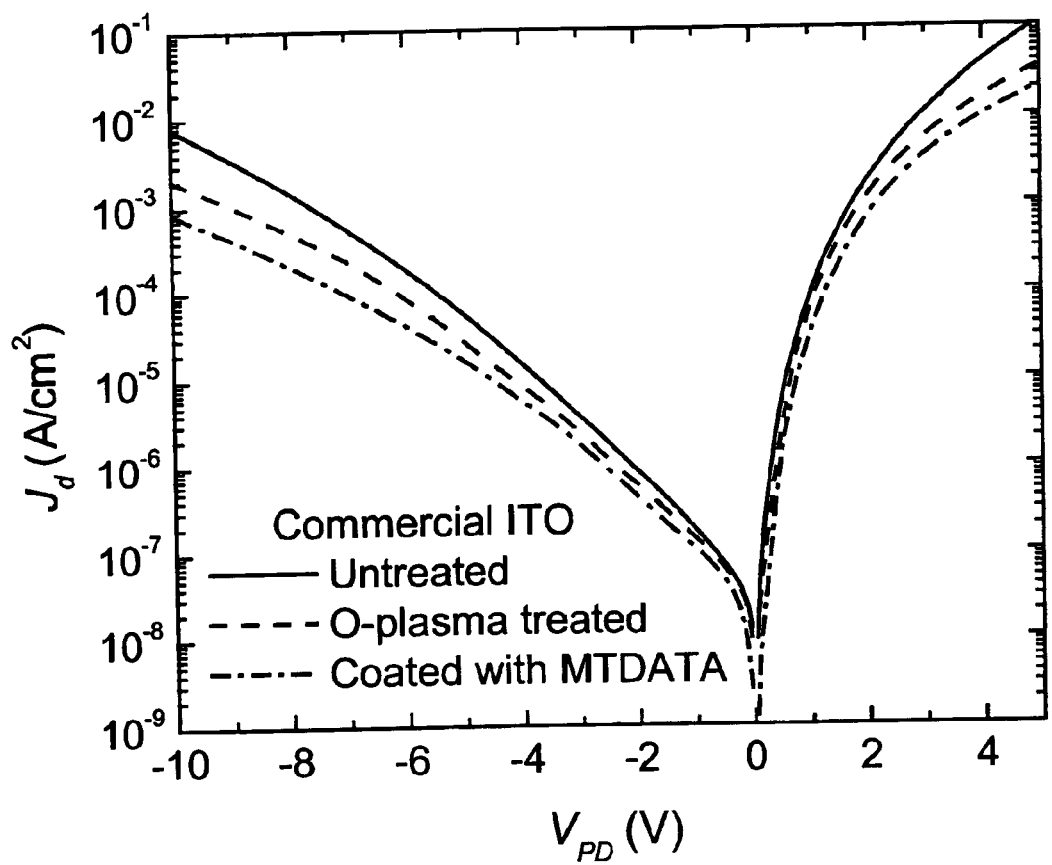
FIG. 18 shows the comparison of dark current density ($J_d$) versus voltage ($V_{PD}$) characteristics for multilayer organic photodetectors with commercial ITO anodes that are untreated or treated. The organic layer structure is the same as devices in FIG. 17.
Figure 19:
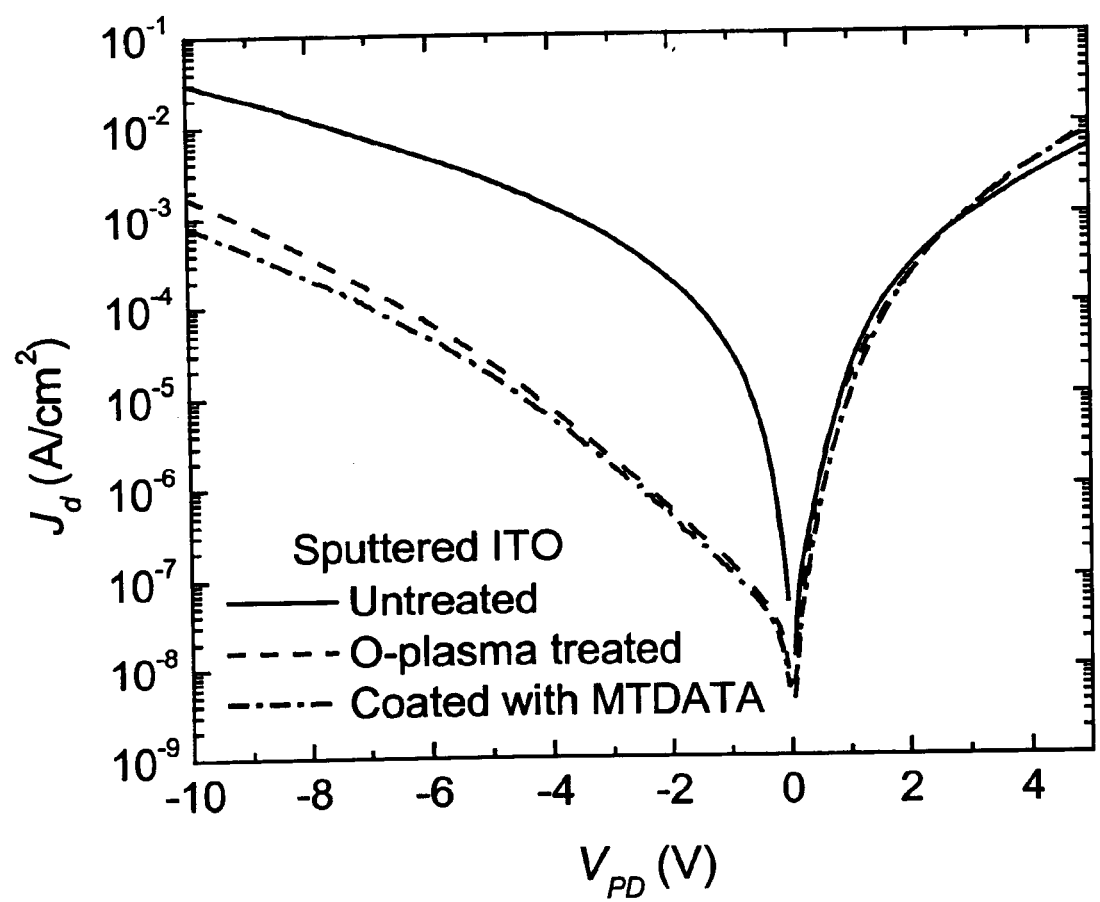
FIG. 19 shows the comparison of dark current density ($J_d$) versus voltage ($V_{PD}$) characteristics for multilayer organic photodetectors with sputtered ITO anodes (sputtered in chamber B at room temperature) that are untreated or treated. The organic layer structure is the same as devices in FIG. 17.

As shown in FIGS. 18 and 19, treating the ITO anodes in an oxygen plasma or coating them with a highly conductive, p-doped MTDATA:F$_4$-TCNQ layer can reduce the photodetector reverse-bias dark current, whose extent depends on the initial ITO properties. For the commercial ITO anodes [FIG. 18], either oxygen plasma treatment or coating with MTDATA leads to a slight decrease in $J_d$ under both forward and reverse biases, although coating with MTDATA leads to a larger reduction in $J_d$. For ITO anodes sputtered in Chamber B [FIG. 19], neither treatment causes significant changes in $J_d$ under forward bias, whereas the reverse-bias dark current is drastically reduced when either treatment is applied. In fact, the photodetectors with sputtered ITO anodes treated by either means have almost the same J–V characteristics under reverse bias as compared with those of treated commercial ITO anodes.

Figure 20:
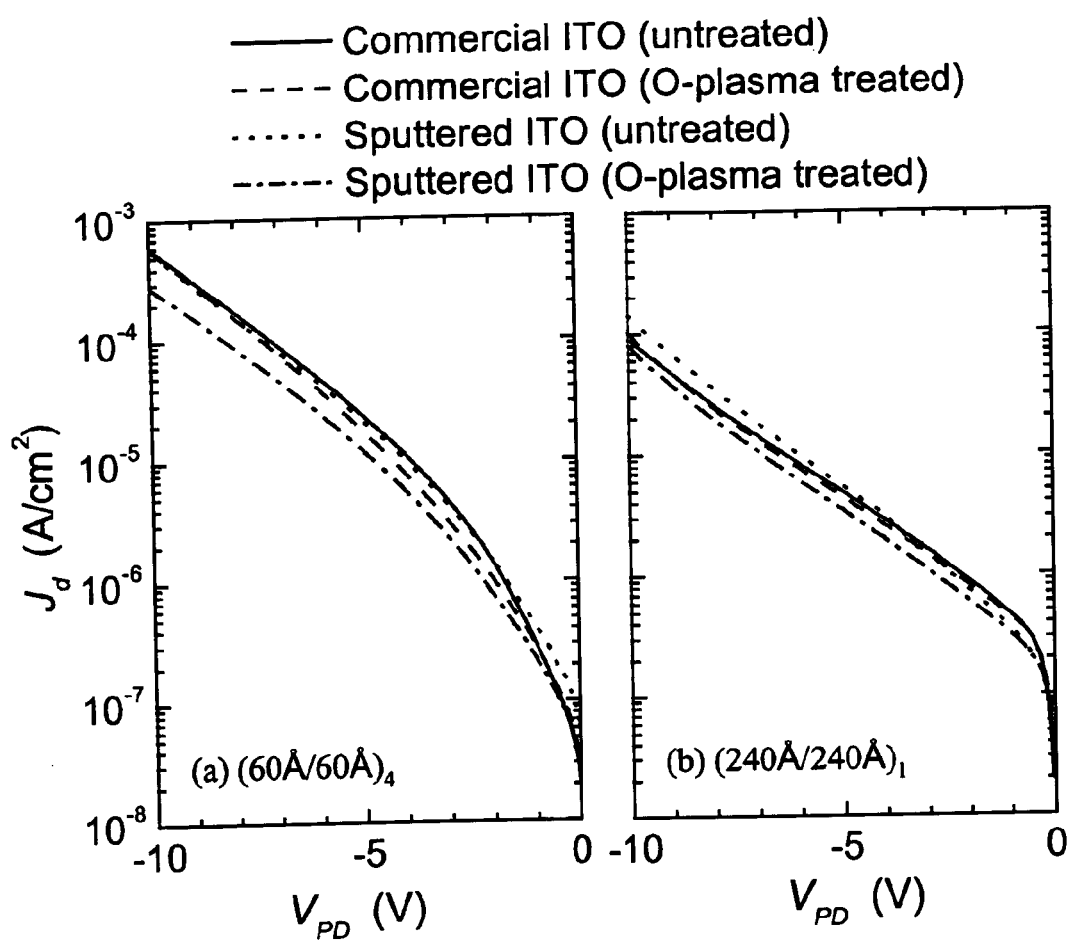
FIG. 20 shows the comparison of dark current density ($J_d$) versus voltage ($V_{PD}$) characteristics for multilayer organic photodetectors fabricated on various ITO anodes with the active region structure of (a)[CuPc(60 Å)/PTCBI(60 Å)]$_4$, and (b)[CuPc(240 Å)/PTCBI(240 Å)]$_1$.
Figure 21:
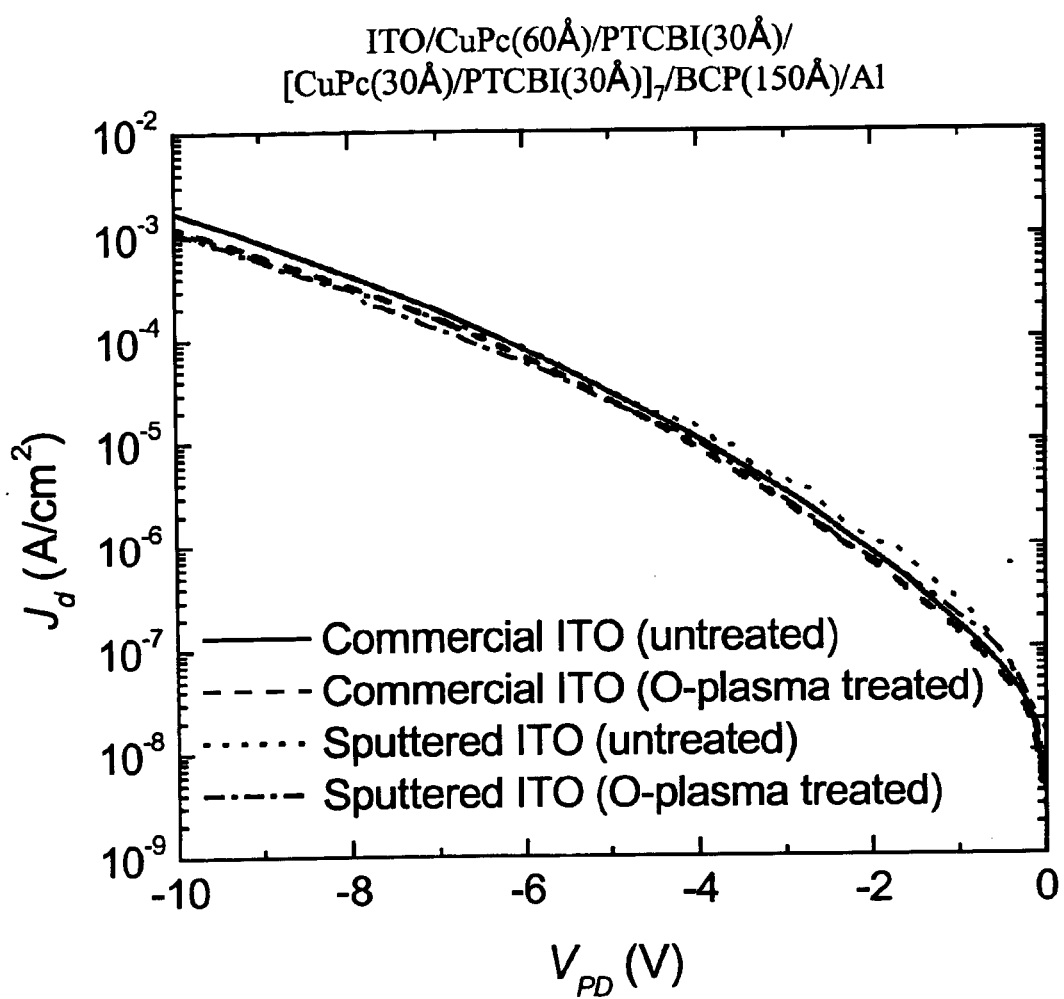
FIG. 21 shows the comparison of dark current density ($J_d$) versus voltage ($V_{PD}$) characteristics for multilayer organic photodetectors fabricated on various anodes with the structure: ITO/CuPc(60 Å)/PTCBI(30 Å)/[CuPc(30 Å)/PTCBI (30 Å)]$_7$/BCP(150 Å)/Al.

The strong dependence of the reverse-bias dark current on the ITO anode properties was only observed in photodetectors with thin (≦30 Å thick) individual layers in the active region. As shown in FIG. 20, when the thicknesses of the CuPc and PTCBI layers are increased to (a) 60 Å or (b) 240 Å while maintaining a total thickness of 480 Å in the active region, neither the type of ITO (commercial or sputtered), nor the application of the oxygen plasma treatment, has a noticeable effect on the reverse-bias dark J–V characteristics. Furthermore, the effects of the anode preparation on the dark current in photodetectors with layers ≦30 Å thick can be mostly eliminated by merely increasing the thickness of the first CuPc layer (in contact with the anode) to ≧60 Å, as shown in FIG. 21. These results suggest that electron tunneling injection from the ITO anode through the first CuPc layer, modeled above, dominates the dark current of the reverse-biased multilayer organic photodetector when the ITO work function is low, and the first CuPc layer is thin (≦30 Å thick).

Figure 22:
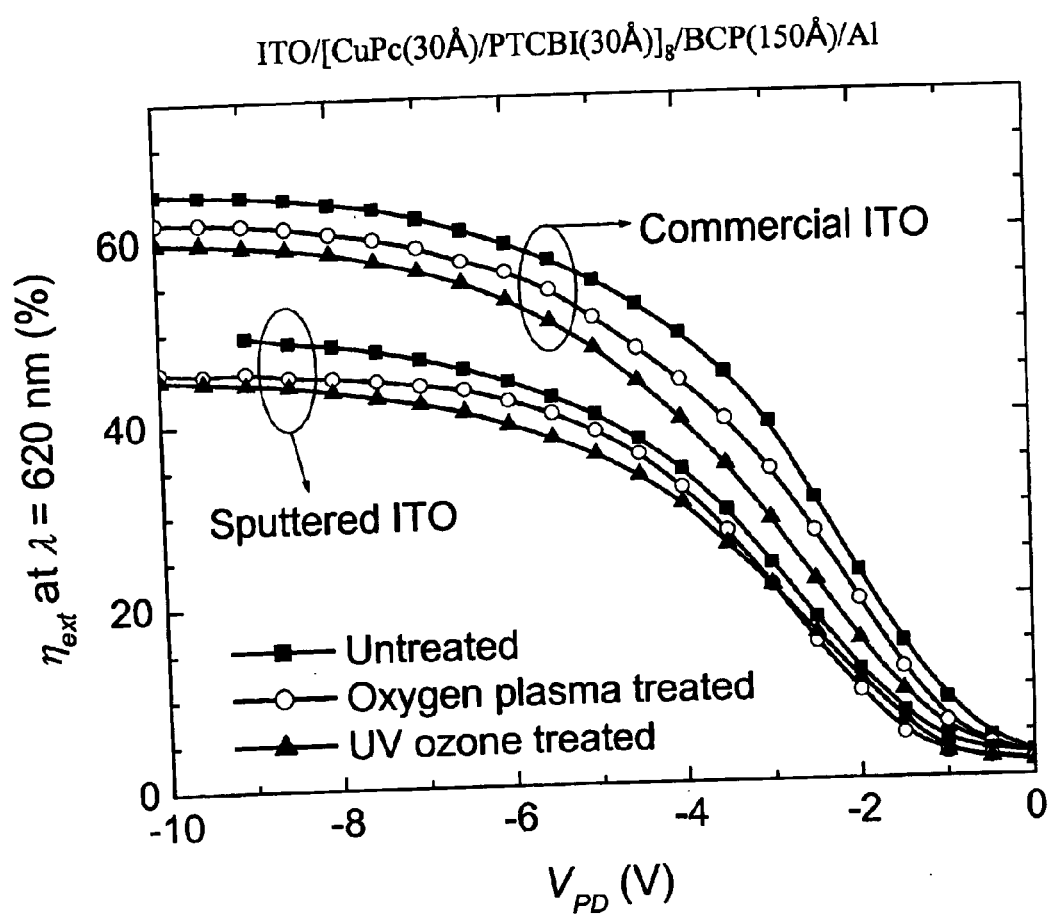
FIG. 22 shows the external quantum efficiencies, $\eta_{ext}$, at a wavelength of $\lambda = 620$ nm of multilayer organic photodetectors fabricated on either commercial or sputtered (in chamber A) ITO anodes, with or without treatment of the ITO prior to the deposition of the organic layers. Note the approximately 10% reduction in $\eta_{ext}$ after the surface treatments.

The quantum efficiency of the organic photodetectors is also affected by the anode properties. Shown in FIG. 22 is the dependence of the external quantum efficiency, $\eta_{ext}$, on $V_{PD}$ at a wavelength of $\lambda=620$ nm for the (30 Å/30 Å)$_8$ photodetectors with different ITO anodes (commercial or sputtered, with or without surface treatment). The photodetectors fabricated on ITO films sputtered in Chamber A have a lower quantum efficiency than photodetectors with commercial ITO anodes. For example, the maximum $\eta_{ext}$ for a photodetector with an untreated commercial ITO anode is 65% (at $V_{PD}$≦$-9$ V), as compared with 50% for one with an untreated sputtered ITO anode. This difference is mainly due to the lower transparency of the sputtered ITO films, which is 70% at $\lambda=620$ nm, significantly less than that of the commercial ITO (85% at $\mu=620$ nm). The oxygen plasma or UV-ozone treatment results in an additional 5–10% decrease in the maximum $\eta_{ext}$, and even more at low reverse biases ($-5$ V<$V_{PD}$<0 V) for photodetectors with commercial ITO anodes.

Figure 23:
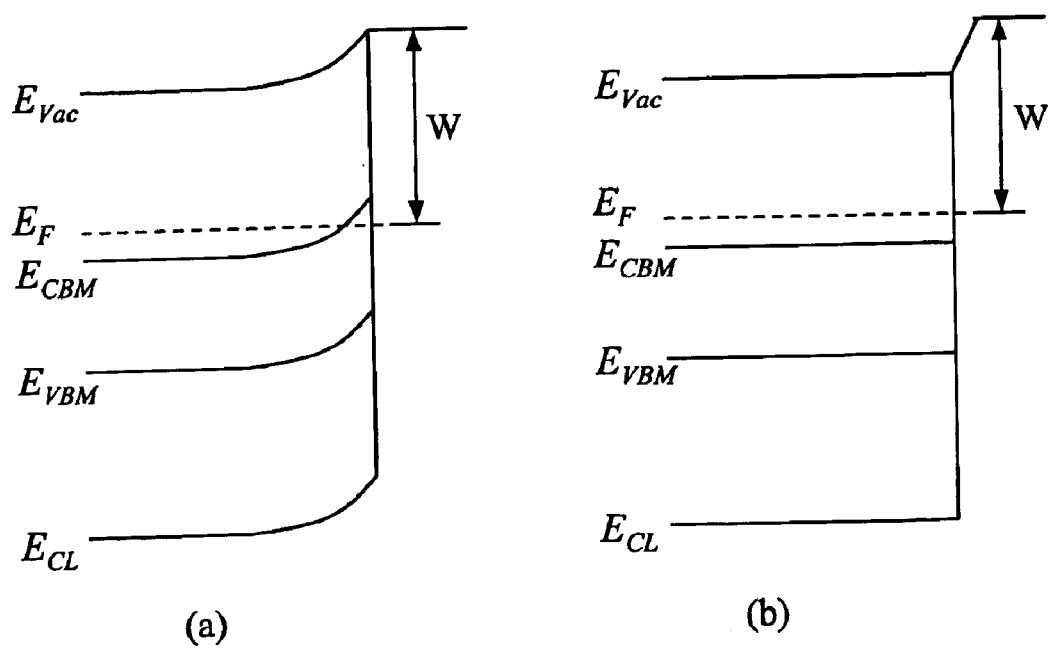
FIG. 23 shows the proposed energy band diagrams of ITO with: (a) surface band bending, or (b) surface dipole. Here, $E_{CBM}$ and $E_{VBM}$ are the conduction band minimum and the valence band maximum, respectively, $E_{Vac}$ is the vacuum level, $E_{CL}$ is a core level, and $E_F$ is the Fermi level. Also, W is the work function, which is taken as the energy difference between the surface vacuum and Fermi levels.

There is a ~0.5 eV increase in the work function of commercial ITO anodes after either oxygen plasma or UV-ozone treatment, and ~0.7 eV for ITO anodes deposited by rf magnetron sputtering in Chamber B. After the oxygen plasma treatment, the valence band maximum moves towards the Fermi level by 0.6 eV (commercial ITO) or 0.5 eV (sputtered ITO), roughly the same as the work function change. As illustrated in FIG. 23(a), assuming that the electron affinity of ITO does not change after exposure to an oxygen plasma, an upward bend of the conduction and valence bands (and the core levels) leads to a similar bend of the vacuum level, thereby increasing the work function.

The UV-ozone treatment results in the same increase in ITO work function as exposure to the oxygen plasma. However, unlike the oxygen plasma treatment, exposure to UV ozone only induces a ~0.1 eV shift of the valence band maximum towards the Fermi level. This can be explained by assuming a dipole layer is formed on the ITO surface, with the direction of the dipole moment pointed towards the ITO bulk. As shown in FIG. 23(b), the dipole layer causes a rise in the vacuum level, leading to an increase in the work function, whereas the position of the valence band relative to the Fermi level remains unchanged.

Previous studies on organic multilayers grown at room temperature in UHV by OMBD have indicated sharp interfaces between the individual layers for film thicknesses down to 11 Å. [S. R. Forrest, Chem. Rev. 97, 1793 (1997)]. It is likely that local shorts between the electrodes may exist on ITO-coated glass substrates with rms roughnesses up to 40 Å, resulting in leakage paths contributing to the dark current. However, no correlation between the surface roughness and the dark current is observed. Indeed, the photodetector with a rough, untreated commercial ITO anode exhibits lower reverse-bias dark currents than one with an untreated, yet smooth sputter-deposited ITO anode. Similarly, treating the anodes in an oxygen plasma causes a decrease in the dark current despite an increase in the surface roughness. Coating the ITO anode with a p-doped MTDATA layer does not significantly change the surface roughness or grain size, however the reverse-bias dark current is reduced, especially in the case of sputtered ITO where the reduction in the dark current is quite large. This also indicates that the structural spikes observed for the MTDATA-coated sputtered ITO have no effect on the dark current.

Although it is difficult to assess the effects of surface treatments on the growth mode of the organic layers, it has been shown that growth of organic thin films by OMBD can be conformable with a variety of substrates. [S. R. Forrest, IEEE J. Sel. Top. Quantum Electron. 6, 1072 (2000)]. Therefore, given that the MTDATA-coated sputtered ITO anode has nearly the same surface morphology as the untreated sputtered ITO, while the magnitude of the dark current in the corresponding photodetectors is vastly different, we consider the surface morphology to be only a minor factor affecting the dark current.

Figure 24:
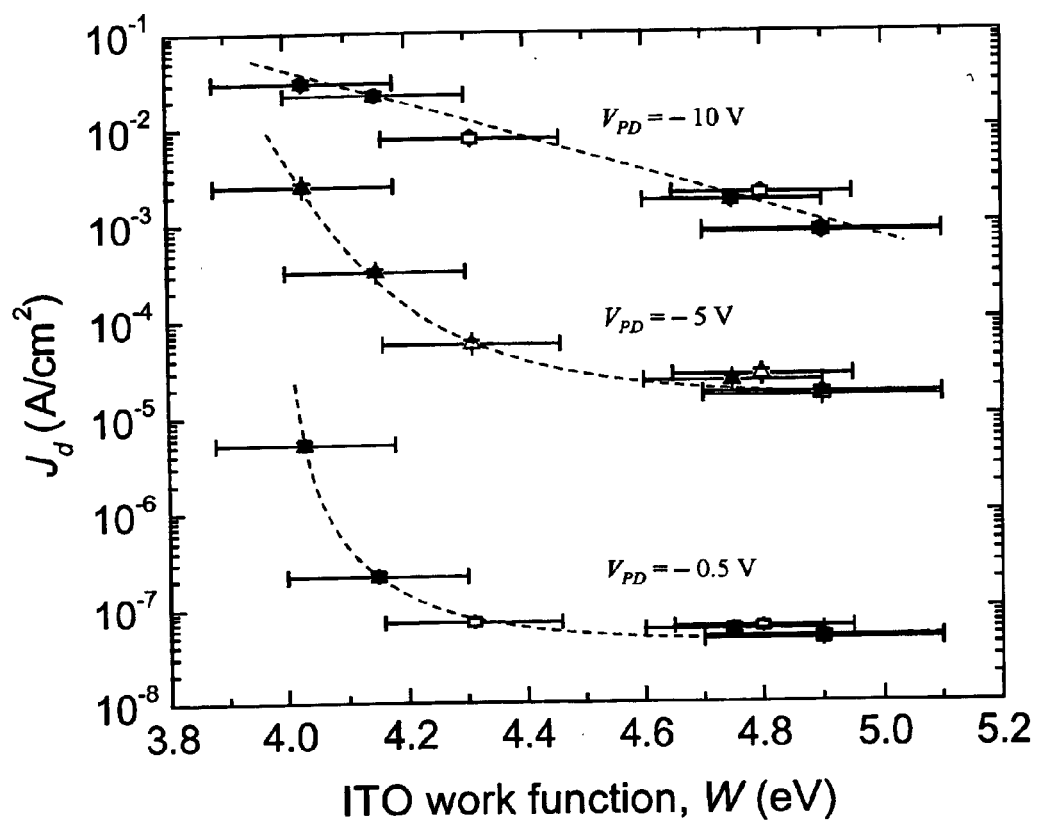
FIG. 24 shows the semi-log plot of the dark current density, $J_d$, as a function of the ITO anode work function, W, for photodetector bias at $V_{PD} = -0.5$ V, $-5$ V, and $-10$ V. Open and filled symbols correspond to commercial and sputtered ITO anodes, respectively, while the dashed lines are guides to the eye. The vertical error bar, taken as 10% of the data according to variations from device to device, cannot be readily distinguished.

In contrast to the anode surface morphology, there is a strong correlation between the anode work function and the photodetector reverse-bias dark current. FIG. 24 shows a semi-log plot of $J_d$ at $V_{PD}$–0.5 V, –5 V, and –10 V for the photodetectors whose dark J–V characteristics are shown in FIGS. 17,18 and 19, as a function of their respective anode work functions, W. The work function of each anode is taken from the UPS measurements in this work, except those of ITO films coated with MTDATA, which are estimated from literature reports [J. Drechsel, M. Pfeiffer, X. Zhou, A. Nollau, and K. Leo, Synth. Met. 127, 201 (2002); Y. Shirota, Y. Kuwabara, and H. Inada, Appl. Phys. Lett. 65, 807 (1994)]. At $V_{PD}$=–10 V, an approximately linear dependence of $\ln J_d$ on W is observed, with $J_d$ increasing ~40 fold as W decreases from 4.9±0.2 eV (corresponding to MTDATA-coated ITO anodes) to 4.03±0.15 eV (corresponding to an untreated ITO film sputtered in chamber B). At a lower reverse bias, e.g. at $V_{PD}$=–5 V, $J_d$ becomes even more sensitive to W at 4.0 eV$\leq$W$\leq$4.3 eV, changing by ~40 times over this range, although $J_d$ is reduced by only a factor of 2 to 3 as W is increased from 4.3 eV to 4.9 eV. At very low reverse bias, e.g. at $V_{PD}$=0.5 V, there exists a severe dependence of $J_d$ on the anode work function at W<4.2 eV, but otherwise $J_d$ is mostly independent of W.

As discussed in Example 1, the major contribution to the current comes from electrons tunneling through the entire thickness of the first CuPc layer, and directly into the lowest unoccupied molecular orbital (LUMO) of the following PTCBI layer (see component IV in FIG. 3). Therefore, the tunneling current depends on the fraction of the electron population in the anode that has sufficient energy to tunnel into the PTCBI LUMO. That is, it depends on the relative position of the anode Fermi level with respect to the PTCBI LUMO. A low ITO work function corresponds to a low barrier height that electrons in the anode must overcome to tunnel into the PTCBI LUMO, thereby leading to a high dark current. On the other hand, with an anode work function W>4.7 eV, electron tunneling from the anode into the organic layers is significantly reduced, so that the dark current is no longer injection limited. Instead, the generation-recombination current in the depleted organic layers becomes important, which does not depend on the anode work function.

The tunneling current should also depend on the thickness of the first CuPc layer according to this model. As we have shown, when the thickness of the first CuPc layer is $\geq$60 Å, the photodetector dark current no longer depends on the anode work function, indicating the maximum tunneling distance of electrons in CuPc is between 30 Å and 60 Å, in agreement with that derived from the photoresponse measurement in Example 1.

Figure 25:
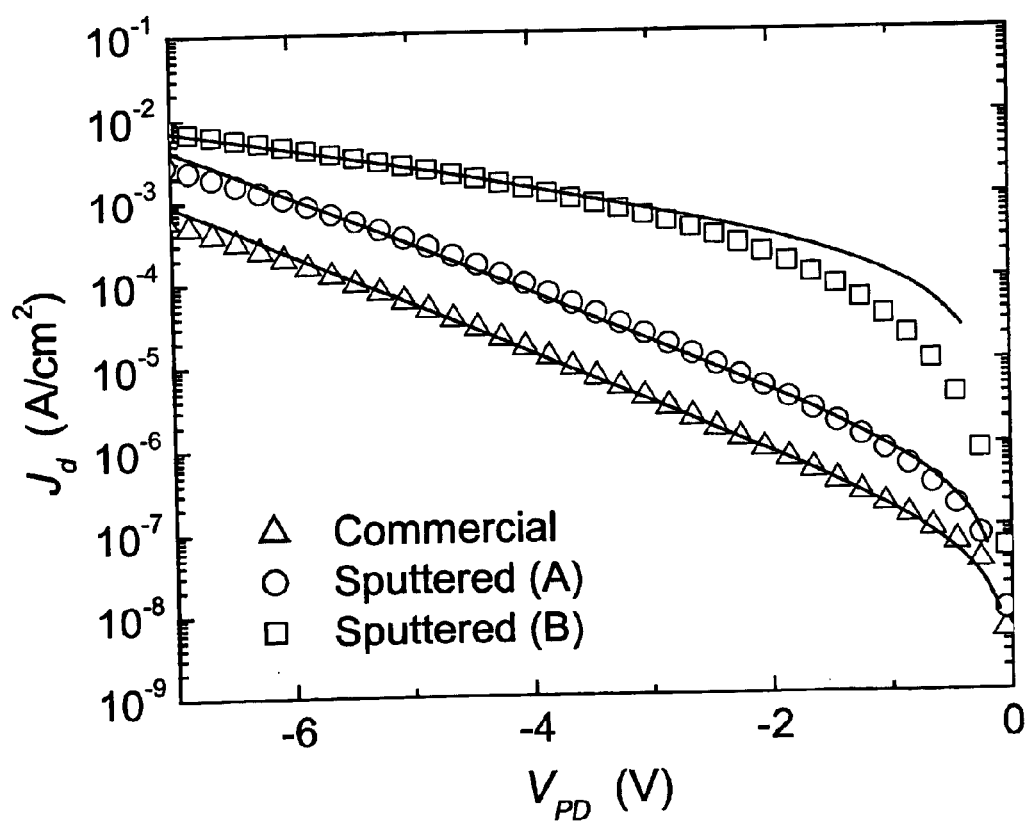
FIG. 25 show the comparison of experimental (symbols) and simulated (lines) dark J–V characteristics of photodetectors with untreated ITO anodes. The parameters for the numerical simulations are listed in Table II.

The theoretical model developed above is further employed to fit the dark J–V characteristics of photodetectors with untreated ITO anodes. Here, according to the results obtained in Example 1, a LUMO level offset between CuPc and PTCBI of $\Delta E_C$=0.93 eV and an effective mass of electrons in CuPc of m*=0.72 me, where $m_e$ is the free-electron mass, are assumed for all the detectors, whereas $\phi_0$–$\Delta E_C$ and $\gamma$ are two free parameters for each detector, where $\phi_0$ is the barrier height for electrons to inject from ITO into CuPc, and $\gamma$ is a constant that relates the electric field to the fraction of voltage dropped across the photodetector active region. Shown in FIG. 25 is a comparison between the experimental data (symbols) and numerical simulations (lines) based on our tunneling model, while the fitting results of $\phi_0$–$\Delta E_C$ and $\gamma$ are listed in Table 3 along with the respective anode work functions.

TABLE 3

| Anode | $\phi_0 - \Delta E_C$ (eV) | $\gamma$ | $\phi_0$ (eV) | W (eV) |
|---|---|---|---|---|
| Commercial | 0.45 ± 0.03 | 0.73 ± 0.10 | 1.38 ± 0.10 | 4.31 ± 0.15 |
| Sputtered, chamber A | 0.40 ± 0.03 | 0.71 ± 0.10 | 1.33 ± 0.10 | 4.15 ± 0.15 |
| Sputtered, chamber B | 0.24 ± 0.02 | 0.28 ± 0.05 | 1.17 ± 0.09 | 4.03 ± 0.15 |

$\Delta E_C$ = (0.93 ± 0.07) eV and m* = (0.72 ± 0.08) $m_e$. The respective anode work function, W, is measured by UPS.

The fitting results clearly show that indeed a higher ITO work function leads to a larger barrier height for electron injection at the ITO/CuPc interface, and the change in the anode work function is approximately the same as the change in the barrier height. The lower value of $\gamma$ for the detector with an untreated ITO anode sputtered in chamber B can be explained by considering the entire device structure. As discussed in above, y<1 suggests that a substantial voltage drop occurs outside the organic active region, most possibly across the BCP exciton-blocking layer. When the electron injection at the anode/organic interface is significantly increased, for example, by using a low work function anode, electrons injected from the anode into the organic layers may build up at the active region/BCP interface, thereby lowering the electric field in the active region and leading to a low $\gamma$.

Despite causing a reduction in the reverse-bias dark current, the exposure to an oxygen plasma or UV-ozone has an adverse effect on the quantum efficiency of the multilayer organic photodetector that cannot be explained in terms of the change in the ITO work function. The change in the density of defect states on the ITO surface or at the ITO/organic interface, however, may be responsible for the reduction in the quantum efficiency after either treatment is applied. Exposure to an oxygen plasma can create a high density of surface defects due to ion bombardment. Also, the removal of carbon-containing contamination on the ITO surface would result in dangling bonds, which introduces defect states at the ITO/organic interface. A decrease in carrier mobility on the treated ITO surface has been reported [A. B. Djurišic, C. Y. Kwong, P. C. Chui, and W. K. Chan, J. Appl. Phys. 93, 5472 (2003)], favoring this explanation. These surface or interface states act as traps to the photogenerated holes. Coating the sputtered ITO anode with a highly conductive, p-doped MTDATA layer has also been found to reduce the external quantum efficiency by ~10%, where the dopants in this layer may also act as traps for photogenerated holes. The electrostatic potential of the trapped holes imposes a potential barrier to prevent other photogenerated holes from transporting to the anode, thus reducing the quantum efficiency. This effect is more severe at lower external electric fields, in agreement with experiment.

The surface morphology and electronic properties of commercially obtained ITO films, or films deposited by rf magnetron sputtering at room temperature can be significantly changed by applying surface treatments including exposure to oxygen plasma or UV-ozone, or coating with a highly conductive MTDATA layer. While it is not affected by the surface morphology of the ITO anode, the dark current strongly depends on the anode work function, with a low anode work function leading to a high dark current. For example, untreated, sputter-deposited ITO films have a lower work function than untreated commercial ITO. As a result, the photodetector fabricated on an untreated, sputter-deposited ITO anode has a one to two orders of magnitude higher dark current than one with an untreated commercial ITO anode. By exposure to oxygen plasma or UV-ozone, or by coating with a MTDATA layer, the ITO work function can be increased, which leads to a significant decrease in the photodetector dark current as compared with photodetectors with untreated anodes. The oxygen plasma or UV-ozone treatment, though, causes a decrease of ~10% in the external quantum efficiency of the photodetectors. This effect is possibly due to an increased density of defect states at the ITO/organic interface. Therefore, a non-destructive surface treatment is needed to increase the anode work function to reduce the dark current, without compromising the photodetector quantum efficiency. Coating the ITO with a highly conductive, p-doped MTDATA layer can increase the anode work function, however, the dopants in this layer may act as traps for photogenerated carriers. Spin-coating the ITO with a poly(3,4-ethylenedioxythiophene):poly(styrenesulfonate) (PEDOT:PSS) layer may also provide an anode with both a high work function and a low defect density.

Although the present invention is described with respect to particular examples and preferred embodiments, it is understood that the present invention is not limited to these examples and embodiments. The present invention as claimed may therefore include variations from the particular examples and preferred embodiments described herein, as will be apparent to one of skill in the art.

What is claimed is:

1. An organic photodetector comprising:
   an anode;
   an active region comprising one or more subcells in series, wherein each subcell comprises an organic electron donor layer and an organic electron acceptor layer, wherein the thicknesses of the organic electron donor layer and the organic electron acceptor layer are low enough to allow tunneling;
   an exciton blocking layer; and
   a cathode,
   wherein the anode comprises a material having a work function greater than about 4.6 eV.

2. The organic photodetector of claim 1, wherein the electron donor layers and the organic electron acceptor layers each have a thickness of less than about 30 Å.

3. The organic photodetector of claim 1, wherein the exciton blocking layer comprises BCP.

4. The organic photodetector of claim 1, wherein the anode has been treated with oxygen plasma, UV ozone, an oxidizing agent, an acid, coated with a p-type doped organic layer, or spin-coating with a transparent conducting organic polymer.

5. The organic photodetector of claim 1, wherein the anode comprises ITO.

6. An organic photodetector comprising:
   an anode;
   an active region comprising one or more subcells in series, wherein each subcell comprises an organic electron donor layer and an organic electron acceptor layer, wherein the thicknesses of the organic electron donor layer and the organic electron acceptor layer are low enough to allow tunneling;
   an exciton blocking layer; and
   a cathode,
   wherein the electron affinity of the organic acceptor layer is about 0.3 eV less than the work function of the anode.

7. The organic photodetector of claim 6, wherein the electron affinity of the organic acceptor layer is about 0.4 eV less than the work function of the anode.

8. The organic photodetector of claim 6, wherein the electron donor layers and the organic electron acceptor layers each have a thickness of less than about 30 Å.

9. The organic photodetector of claim 6, wherein the exciton blocking layer comprises BCP.

10. The organic photodetector of claim 6, wherein the anode comprises ITO.

11. The organic photodetector of claim 10, wherein the anode has been treated with oxygen plasma, UV ozone, an oxidizing agent, an acid, coated with a p-type doped organic layer, or spin-coating with a transparent conducting organic polymer.

12. An organic photodetector comprising:
   an anode;
   a first subcell comprising an organic electron donor layer adjacent to the anode and having a sufficient thickness to inhibit tunneling into the adjacent acceptor layer;
   one or more additional subcells in series, wherein each additional subcell comprises an organic electron donor layer and an organic electron acceptor layer, wherein the thicknesses of the organic electron donor layer and an organic electron acceptor layer are low enough to allow tunneling;
   an exciton blocking layer; and
   a cathode.

13. The organic photodetector of claim 12, wherein the organic electron donor layer of the first subcell has a thickness of at least about 60 Å.

14. The organic photodetector of claim 12, wherein the electron donor layers and the organic electron acceptor layers each have a thickness of less than about 30 Å.

15. The organic photodetector of claim 12, wherein the exciton blocking layer comprises BCP.

16. The organic photodetector of claim 12, wherein the anode comprises ITO.

17. The organic photodetector of claim 16, wherein the anode has been treated with oxygen plasma, UV ozone, an oxidizing agent, an acid, coated with a p-type doped organic layer, or spin-coating with a transparent conducting organic polymer.

* * * * *

UNITED STATES PATENT AND TRADEMARK OFFICE
CERTIFICATE OF CORRECTION

PATENT NO. : 6,972,431 B2  
DATED : December 6, 2005  
INVENTOR(S) : Forrest et al.

It is certified that error appears in the above-identified patent and that said Letters Patent is hereby corrected as shown below:

<u>Column 1,</u>  
Line 4, insert the following paragraph:

-- GOVERNMENT RIGHTS  
This invention was made with Government support under Contract No. F49620-00-1-0065 awarded by AFOSR. The government has certain rights in this invention. --.

Signed and Sealed this

Sixth Day of June, 2006

JON W. DUDAS  
*Director of the United States Patent and Trademark Office*